(12) United States Patent
Weng et al.

(10) Patent No.: US 12,484,175 B2
(45) Date of Patent: Nov. 25, 2025

(54) ELECTRONIC APPARATUS WITH A TWO-WAY CABLE CONNECTION CONSTRUCTION, RELATED CASING KIT AND RELATED ELECTRONIC DEVICE

(71) Applicant: Moxa Inc., New Taipei (TW)

(72) Inventors: Chen-Kai Weng, New Taipei (TW); Chun-Jen Shih, New Taipei (TW); Chen-Yu Liang, New Taipei (TW); Yen-Sheng Chen, New Taipei (TW); Chi Chen, New Taipei (TW); Ju-Hsien Cheng, New Taipei (TW)

(73) Assignee: Moxa Inc., New Taipei (TW)

( * ) Notice: Subject to any disclaimer, the term of this patent is extended or adjusted under 35 U.S.C. 154(b) by 110 days.

(21) Appl. No.: 18/648,464

(22) Filed: Apr. 28, 2024

(65) Prior Publication Data

US 2025/0089195 A1 Mar. 13, 2025

Related U.S. Application Data

(60) Provisional application No. 63/537,208, filed on Sep. 8, 2023.

(30) Foreign Application Priority Data

Feb. 6, 2024 (TW) .................. 113104589

(51) Int. Cl.
*H05K 7/10* (2006.01)
*H05K 1/14* (2006.01)
*H05K 5/00* (2006.01)

(52) U.S. Cl.
CPC .............. *H05K 7/10* (2013.01); *H05K 1/141* (2013.01); *H05K 5/0069* (2013.01)

(58) Field of Classification Search
None
See application file for complete search history.

(56) References Cited

U.S. PATENT DOCUMENTS

| 7,499,289 B2 * | 3/2009 | Liang | G06F 1/185 |
| | | | 361/728 |
| 7,639,507 B2 * | 12/2009 | Chen | G06F 1/185 |
| | | | 361/752 |

(Continued)

FOREIGN PATENT DOCUMENTS

| CN | 205724155 U | 11/2016 |
| CN | 111752345 A | 10/2020 |

(Continued)

*Primary Examiner* — Xanthia C Relford
(74) *Attorney, Agent, or Firm* — Winston Hsu

(57) ABSTRACT

An electronic apparatus with a two-way cable connection construction is provided. The electronic apparatus includes a casing kit and an electronic device. The casing kit includes a casing, a main circuit board and an auxiliary circuit board. The main circuit board and the auxiliary circuit board are disposed inside the casing. The auxiliary circuit board and the main circuit board are electrically connected to each other and non-coplanar with each other. When the electronic device is inserted into a mounting slot of the casing along a first direction, a mating electrical connector of the electronic device is connected to a first electrical connector of the auxiliary circuit board. When the electronic device is inserted into the mounting slot of the casing along a second direction opposite to the first direction, the mating electrical connector of the electronic device is connected to a second electrical connector of the auxiliary circuit board.

28 Claims, 24 Drawing Sheets

(56) References Cited

U.S. PATENT DOCUMENTS

| | | | | |
|---|---|---|---|---|
| 9,532,480 | B2* | 12/2016 | Shen | G06F 1/184 |
| 9,642,280 | B2* | 5/2017 | Chen | H05K 7/1487 |
| 10,349,537 | B1* | 7/2019 | Federizo | H05K 1/181 |
| 11,266,034 | B1* | 3/2022 | Lee | H05K 5/02 |
| 2008/0106862 | A1* | 5/2008 | Liang | H05K 1/14 |
| | | | | 361/679.41 |
| 2021/0267084 | A1 | 8/2021 | Anderson | |
| 2023/0056822 | A1* | 2/2023 | Tadele | H05K 1/144 |

FOREIGN PATENT DOCUMENTS

| | | |
|---|---|---|
| CN | 116166100 A | 5/2023 |
| JP | 2000-102045 A | 4/2000 |
| TW | M523985 U | 6/2016 |

* cited by examiner

ELECTRONIC APPARATUS WITH A TWO-WAY CABLE CONNECTION CONSTRUCTION, RELATED CASING KIT AND RELATED ELECTRONIC DEVICE

CROSS REFERENCE TO RELATED APPLICATIONS

This application claims the benefit of U.S. Provisional Application No. 63/537,208, filed on Sep. 8, 2023. The content of the application is incorporated herein by reference.

BACKGROUND OF THE INVENTION

1. Field of the Invention

The present invention relates to an electronic apparatus, and more specifically, to an electronic apparatus with a two-way cable connection construction, a related casing kit and a related electronic device.

2. Description of the Prior Art

A cable routing orientation of an electronic apparatus, e.g., a signal switch, cannot be changed at will after the electronic apparatus is mounted on a rack. Therefore, at a design stage, the cable routing orientation of the electronic apparatus should be determined to be a forward orientation or a rearward orientation in consideration of a field cable layout to allow front-end cable routing or rear-end cable routing. Therefore, it lacks flexibility.

SUMMARY OF THE INVENTION

It is an objective of the present invention to provide an electronic apparatus with a two-way cable connection construction, a related casing kit and a related electronic device for solving the aforementioned problem.

In order to achieve the aforementioned objective, the present invention discloses an electronic apparatus with a two-way cable connection construction. The electronic apparatus includes a casing kit and a first electronic device. The casing kit includes a casing, a main circuit board and an auxiliary circuit board. The casing includes a first wall, a second wall and a first mounting slot. The second wall is opposite to the first wall. A first opening is formed on the first wall of the casing and communicated with the first mounting slot. A second opening is formed on the second wall of the casing and communicated with the first mounting slot. The main circuit board is disposed inside the casing. The auxiliary circuit board is disposed inside the casing and electrically connected to the main circuit board. The auxiliary circuit board and the main circuit board are non-coplanar with each other. The auxiliary circuit board includes a board body, a first electrical connector and a second electrical connector. The first electrical connector and the second electrical connector are respectively disposed on a first side of the board body and a second side of the board body opposite to the first side of the board body. The first electronic device is configured to be detachably inserted into the first mounting slot of the casing. When the first electronic device is inserted into the first mounting slot of the casing through the first opening along a first direction, a first mating electrical connector of the first electronic device being connected to the first electrical connector of the auxiliary circuit board. When the first electronic device is inserted into the first mounting slot of the casing through the second opening along a second direction opposite to the first direction, the first mating electrical connector of the first electronic device being connected to the second electrical connector of the auxiliary circuit board.

According to an embodiment of the present invention, the auxiliary circuit board and the main circuit board are stacked one above another.

According to an embodiment of the present invention, the auxiliary circuit board and the main circuit board are perpendicular to each other.

According to an embodiment of the present invention, the electronic apparatus further includes a second electronic device. The casing further includes a second mounting slot, and a third opening is formed on the first wall of the casing and communicated with the second mounting slot for allowing the second electronic device to be inserted into the second mounting slot of the casing through the third opening along the first direction.

According to an embodiment of the present invention, the auxiliary circuit board further includes a third electrical connector configured to be connected to a second mating electrical connector of the second electronic device when the second electronic device is inserted into the second mounting slot of the casing through the third opening along the first direction.

According to an embodiment of the present invention, the main circuit board further includes a fourth electrical connector configured to be connected to a third mating electrical connector of the second electronic device when the second electronic device is inserted into the second mounting slot of the casing through the third opening along the first direction.

According to an embodiment of the present invention, the casing kit further includes a supporting component configured to support the auxiliary circuit board.

According to an embodiment of the present invention, the casing further includes a first longitudinal wall and a second longitudinal wall. The first mounting slot is defined by the first longitudinal wall and the second longitudinal wall cooperatively, and the supporting component is spanned between the first longitudinal wall and the second longitudinal wall.

According to an embodiment of the present invention, the casing kit further includes a bracket fixedly connected to the casing and the supporting component and configured to carry the auxiliary circuit board.

According to an embodiment of the present invention, the casing kit further includes a bracket fixedly connected to the casing and configured to carry the auxiliary circuit board.

Furthermore, the present invention further discloses a casing kit. The casing kit includes a casing, a main circuit board and an auxiliary circuit board. The casing includes a first wall, a second wall and a first mounting slot. The second wall is opposite to the first wall. A first opening is formed on the first wall of the casing and communicated with the first mounting slot. A second opening is formed on the second wall of the casing and communicated with the first mounting slot. The main circuit board is disposed inside the casing. The auxiliary circuit board is disposed inside the casing and electrically connected to the main circuit board. The auxiliary circuit board and the main circuit board are non-coplanar with each other. The auxiliary circuit board includes a board body, a first electrical connector and a second electrical connector. The first electrical connector and the second electrical connector are respectively disposed on a first side of the board body and a second side of the board body opposite to the first side of the board body.

Besides, the present invention further discloses an electronic device. The electronic device includes a mating electrical connector. The mating electrical connector is configured to be connected to a first electrical connector of an auxiliary circuit board of a casing kit when the electronic device is inserted into a first mounting slot of a casing of the casing kit along a first direction, and the mating electrical connector is further configured to be connected to a second electrical connector of the auxiliary circuit board of the casing kit when the electronic device is inserted into the first mounting slot of the casing of the casing kit along a second direction opposite to the first direction.

According to an embodiment of the present invention, the electronic device further includes a first portion and a second portion. The first portion and the second portion have different heights, so as to form a step-shaped structure cooperatively to provide an avoiding space for preventing interference with the auxiliary circuit board of the casing kit, and the mating electrical connector is located adjacent to a height rising part of the step-shaped structure.

According to an embodiment of the present invention, the electronic device further includes a terminal. The terminal is configured to be exposed out of a first wall of the casing for allowing a cable to connect to the terminal along the first direction when the electronic device is inserted into the first mounting slot of the casing along the first direction, and the terminal is further configured to be exposed out of a second wall of the casing for allowing the cable to connect to the terminal along the second direction when the electronic device is inserted into the first mounting slot of the casing along the second direction.

In summary, in the present invention, when the first electronic device is inserted into the first mounting slot of the casing through the first opening along the first direction, the first mating electrical connector of the first electronic device is connected to the first electrical connector of the auxiliary circuit board, and the terminal of the first electronic device is exposed out of the first wall of the casing via the first opening for allowing the cable to connect to the terminal of the first electronic device along the first direction. On the other hand, when the first electronic device is inserted into the first mounting slot of the casing through the second opening along the second direction, the first mating electrical connector of the first electronic device is connected to the second electrical connector of the auxiliary circuit board, and the terminal of the first electronic device is exposed out of the second wall of the casing via the second opening for allowing the cable to connect to the terminal of the first electronic device along the second direction. The present invention has a cable routing orientation switchable between a forward orientation and a rearward orientation to allow front-end cable routing or rear-end cable routing according to a field cable layout, and therefore, the present invention has improved flexibility.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct electrical/mechanical connection. Thus, if a first device is connected to a second device, that connection may be through a direct electrical/mechanical connection, or through an indirect electrical/mechanical connection via other devices and connections.

Figure 1:
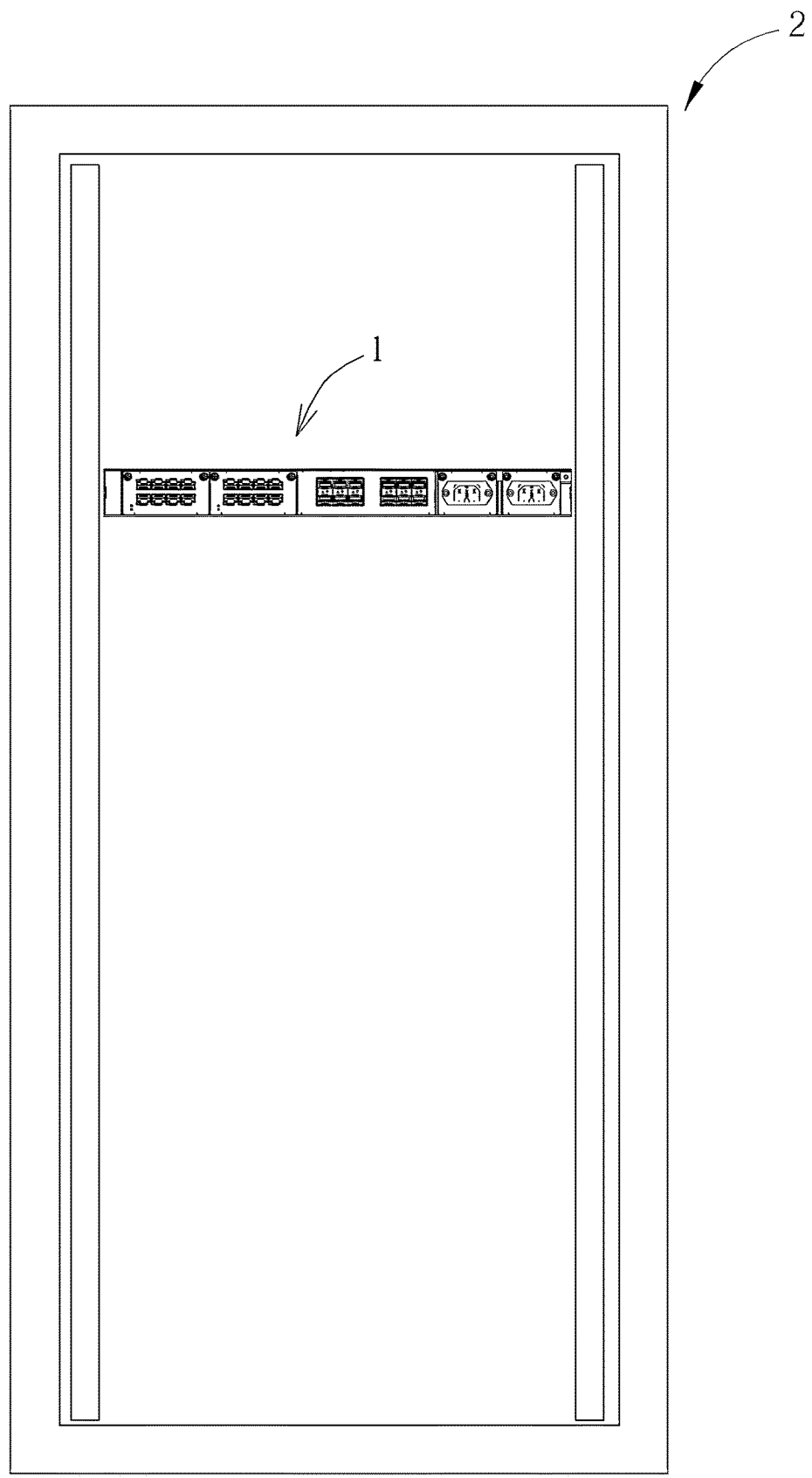
FIG. 1 is a diagram of an electronic apparatus mounted on a cabinet according to a first embodiment of the present invention.
Figure 2:
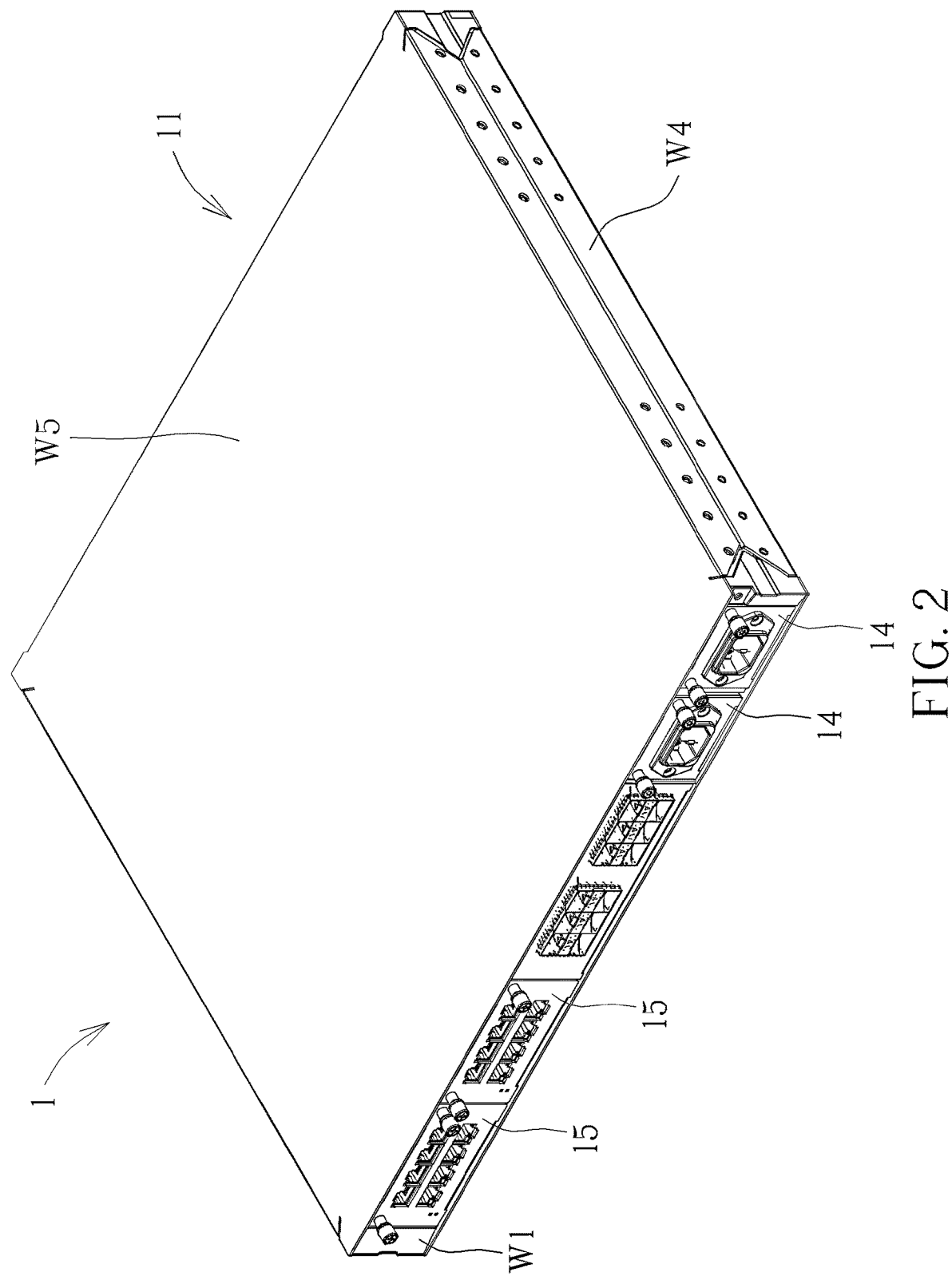
FIG. 2 is a schematic diagram of the electronic apparatus according to the first embodiment of the present invention.
Figure 3:
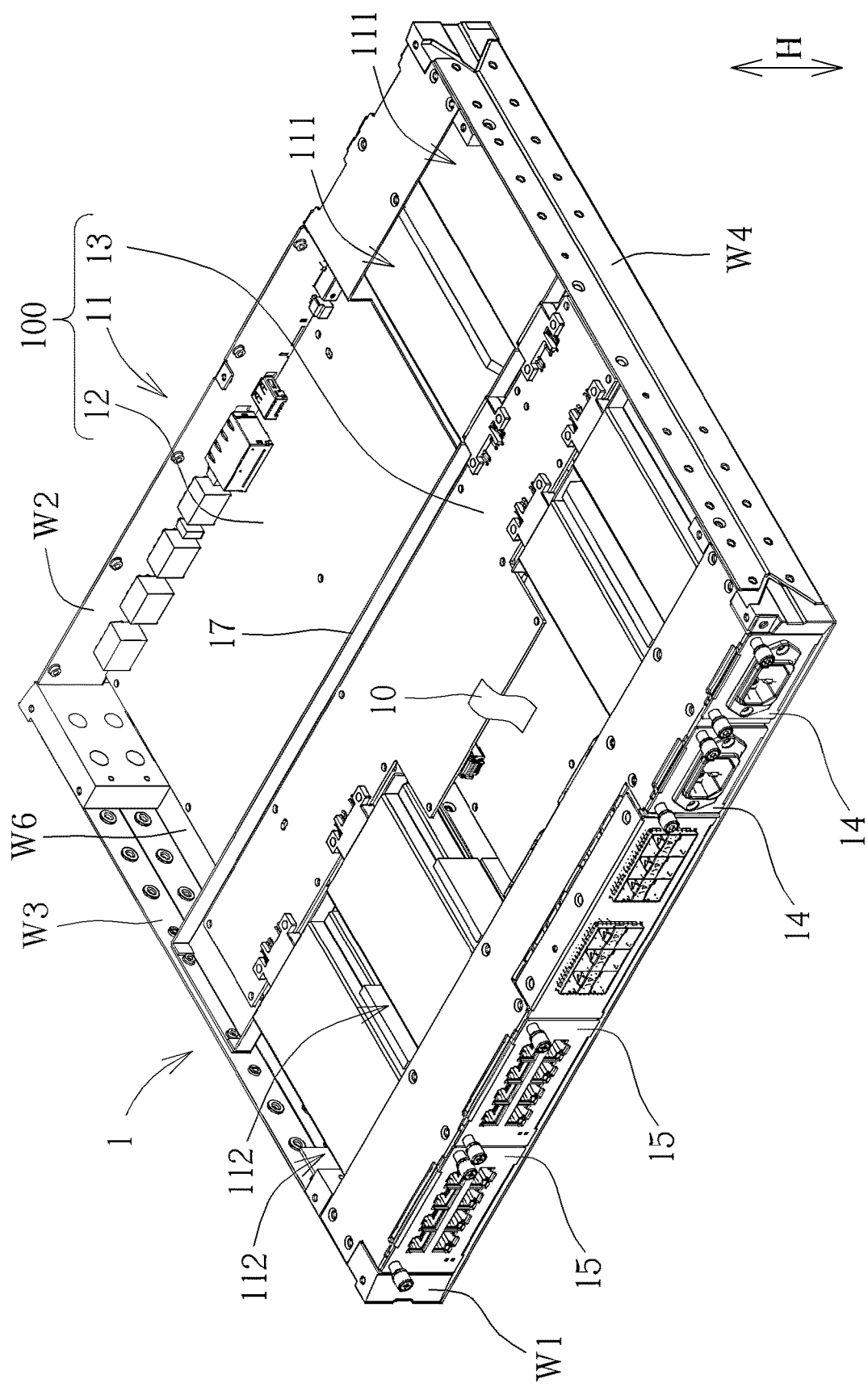
FIG. 3 is a partial internal structural diagram of the electronic apparatus according to the first embodiment of the present invention.
Figure 4:
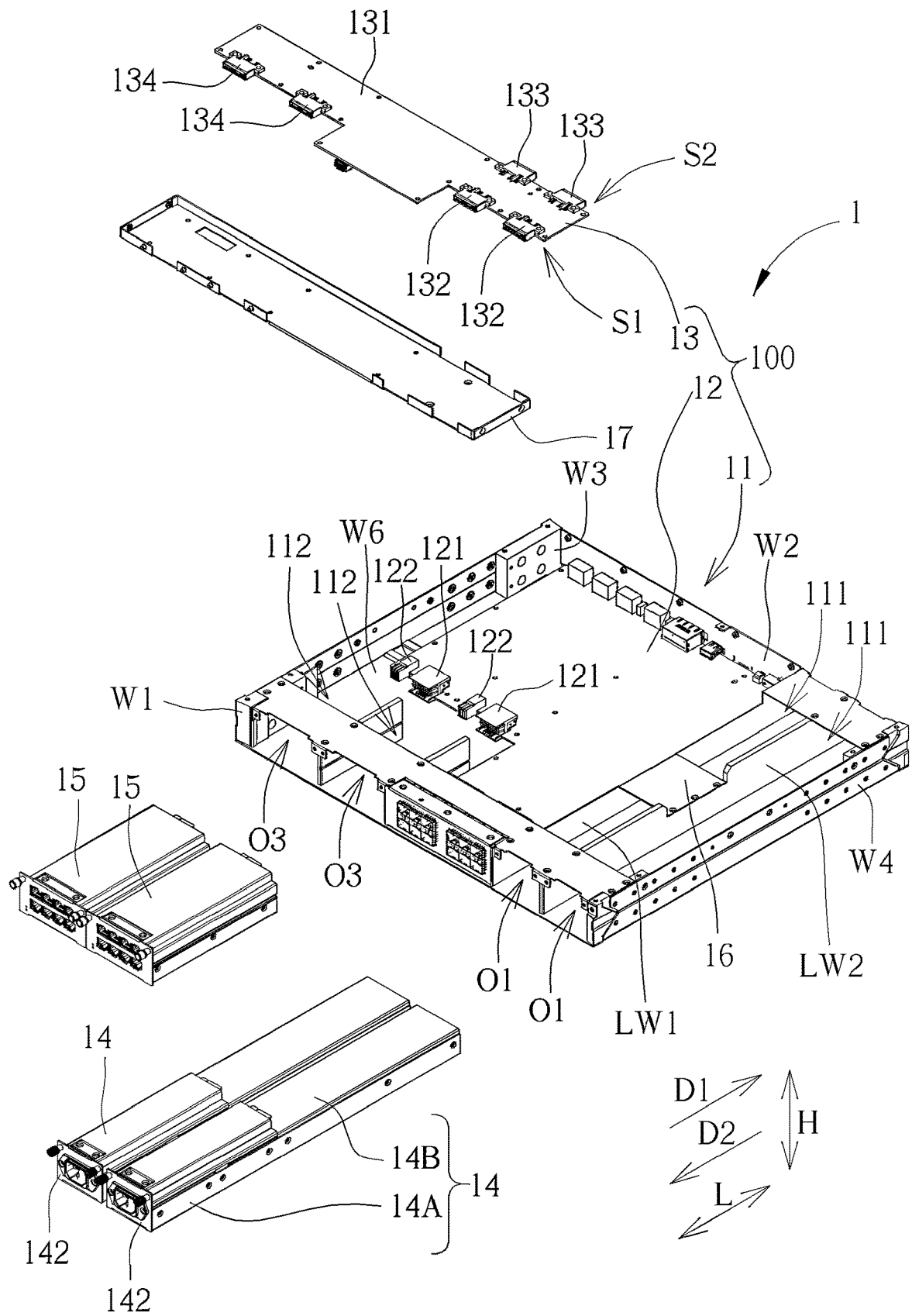
FIG. 4 and FIG. 5 are partial exploded diagrams of the electronic apparatus at different views according to the first embodiment of the present invention.
Figure 5:
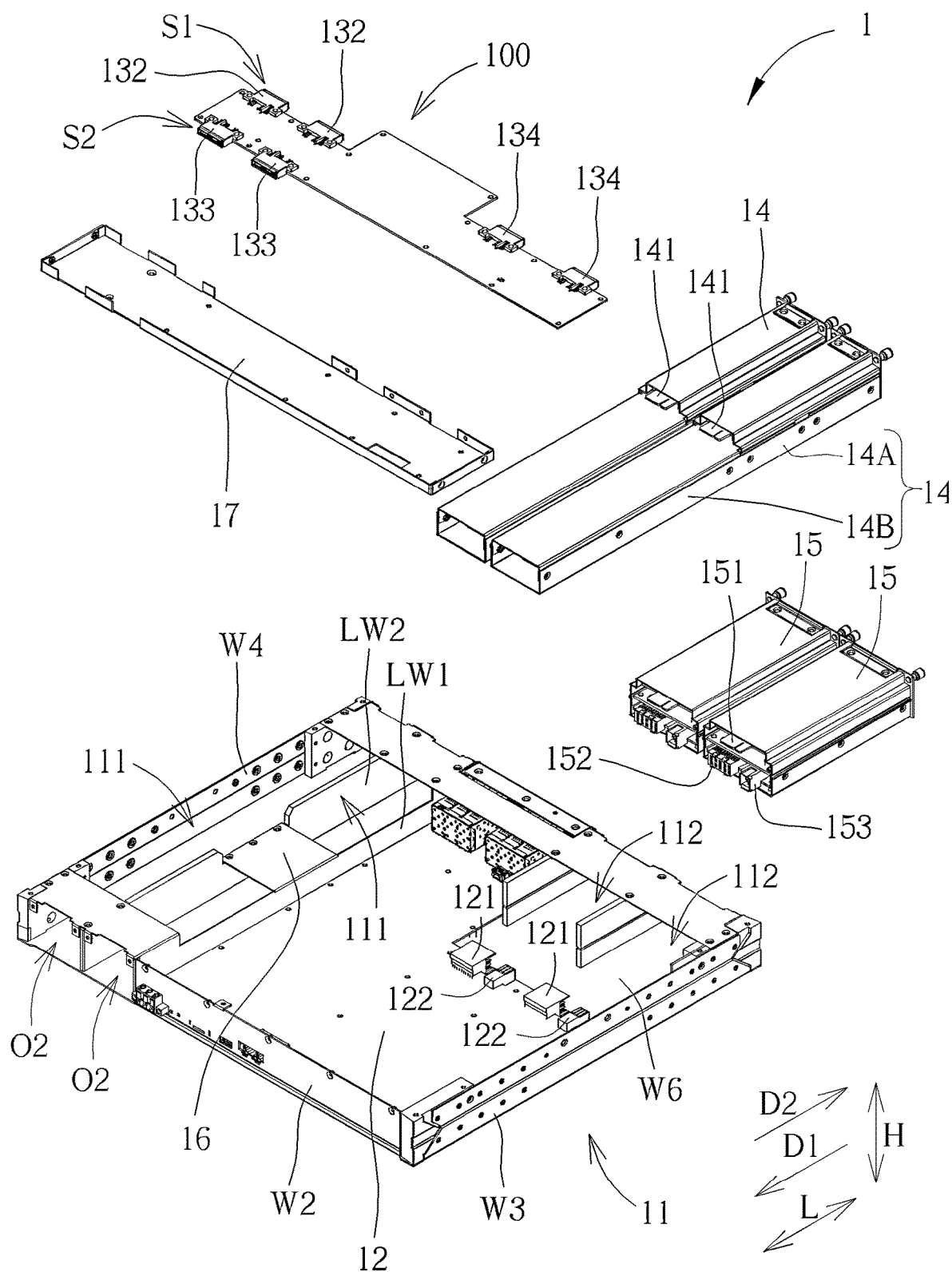

Please refer to FIG. 1 to FIG. 5. FIG. 1 is a diagram of an electronic apparatus 1 mounted on a cabinet 2 according to a first embodiment of the present invention. FIG. 2 is a schematic diagram of the electronic apparatus 1 according to the first embodiment of the present invention. FIG. 3 is a partial internal structural diagram of the electronic apparatus 1 according to the first embodiment of the present invention. FIG. 4 and FIG. 5 are partial exploded diagrams of the electronic apparatus 1 at different views according to the first embodiment of the present invention. As shown in FIG. 1 to FIG. 5, the electronic apparatus 1 includes a casing kit 100, two first electronic devices 14 and two second electronic devices 15. The casing kit 100 includes a casing 11, a main circuit board 12 and an auxiliary circuit board 13. The main circuit board 12 is disposed inside the casing 11. The auxiliary circuit board 13 is disposed inside the casing 11 and electrically connected to the main circuit board 12, e.g., by a flexible flat cable 10. The auxiliary circuit board 13 and the main circuit board 12 are non-coplanar with each other. The casing 11 includes two first mounting slots 111 and two second mounting slots 112. The two first mounting slots 111 are configured to receive the two first electronic devices 14, respectively, and the two second mounting slots 112 are configured to receive the two second electronic devices 15, respectively. In this embodiment, the electronic apparatus 1 can be an Ethernet switch mounted on the cabinet 2, and each of the two first electronic devices 14 and each of the two second electronic devices 15 are a power supply device and an Ethernet interface device, respectively. However, the present invention is not limited to this embodiment.

Figure 6:
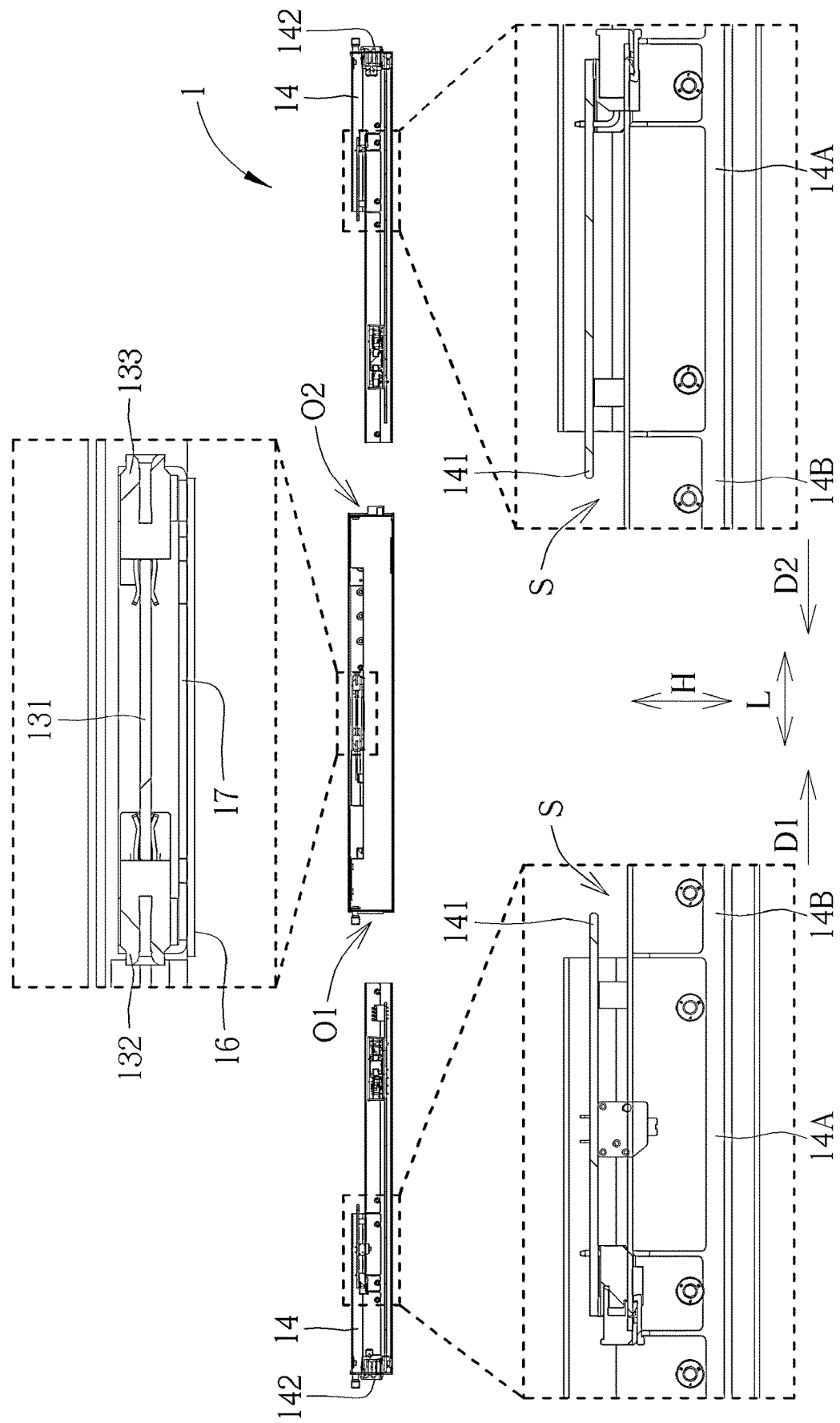
FIG. 6 is a diagram illustrating a first electronic device is being inserted into a first mounting slot of a casing along different directions according to the first embodiment of the present invention.

Please refer to FIG. 2 to FIG. 6. FIG. 6 is a diagram illustrating the first electronic device 14 is being inserted into the first mounting slot 111 of the casing 11 along different directions according to the first embodiment of the present invention. As shown in FIG. 2 to FIG. 6, the casing 11 includes a first wall W1, a second wall W2, a third wall W3, a fourth wall W4, a fifth wall W5 and a sixth wall W6. Two first openings O1 are formed on the first wall W1 and respectively communicated with the two first mounting slots 111, such that the two first electronic devices 14 are allowed to be detachably inserted into the two first mounting slots 111 through the two first openings O1 along a first direction D1, respectively. Two second openings O2 are formed on the second wall W2 and respectively communicated with the two first mounting slots 111, such that the two first electronic devices 14 are allowed to be detachably inserted into the two first mounting slots 111 through the two second openings O2 along a second direction D2 opposite to the first direction D1, respectively. Besides, two third openings O3 are further formed on the first wall W1 and respectively communicated with the two second mounting slots 112, such that the two second electronic devices 15 are allowed to be detachably inserted into the two second mounting slots 112 through the two third openings O3 along the first direction D1, respectively In this embodiment, the first wall W1, the second wall W2, the third wall W3, the fourth wall W4, the fifth wall W5 and the sixth wall W6 of the casing 11 can be a front wall, a rear wall, a left wall, a right wall, a top wall and a bottom wall of the casing 11, respectively. However, the present invention is not limited to this embodiment.

In addition, as shown in FIG. 2 to FIG. 6, the auxiliary circuit board 13 includes a board body 131, two first electrical connectors 132 and two second electrical connectors 133. Each of the two first electrical connectors 132 and each of the two second electrical connectors 133 are respectively disposed on a first side S1 of the board body 131 and a second side S2 of the board body 131 opposite to the first side S1 of the board body 131. As shown in FIG. 6, when the first electronic device 14 is inserted into the corresponding first mounting slot 111 of the casing 11 through the corresponding first opening O1 along the first direction D1, a first mating electrical connector 141 of the first electronic device 14 is connected to the corresponding first electrical connector 132 of the auxiliary circuit board 13, such that the first electronic device 14 can be electrically communicated with the main circuit board 12 through the auxiliary circuit board 13 by connections of the corresponding electrical connectors for signal and/or power transmission. When the first electronic device 14 is inserted into the corresponding first mounting slot 111 of the casing 11 through the corresponding second opening O2 along the second direction D2, the first mating electrical connector 141 of the first electronic device 14 is connected to the corresponding second electrical connector 133 of the auxiliary circuit board 13, such that the first electronic device 14 can be electrically communicated with the main circuit board 12 through the auxiliary circuit board 13 by connections of the corresponding electrical connectors for signal and/or power transmission.

Furthermore, as shown in FIG. 6, when the first electronic device 14 is inserted into the corresponding first mounting slot 111 of the casing 11 through the corresponding first opening O1 along the first direction D1, a terminal 142 of the first electronic device 14 is exposed out of the first wall W1 of the casing 11 via the first opening O1 for allowing a cable to connect to the terminal 142 of the first electronic device 14 along the first direction D1. When the first electronic device 14 is inserted into the corresponding first mounting slot 111 of the casing 11 through the corresponding second opening O2 along the second direction D2, the terminal 142 of the first electronic device 14 is exposed out of the second wall W2 of the casing 11 via the second opening O2 for allowing the cable to connect to the terminal 142 of the first electronic device 14 along the second direction D2.

It should be noticed that, as shown in FIG. 2 to FIG. 5, in this embodiment, the auxiliary circuit board 13 and the main circuit board 12 are stacked one above another in parallel along a height direction H, which is substantially perpendicular to the first direction D1 and the second direction D2.

Specifically, the auxiliary circuit board 13 is disposed above the main circuit board 12 and parallel to the main circuit board 12. Each of the two first electronic devices 14 is formed in a step-shaped structure, so as to provide an avoiding space S for preventing interference with the auxiliary circuit board 13. That is, each of the two first electronic devices 14 can include a first portion 14A and a second portion 14B having different heights, so as to form the step-shaped structure cooperatively, and the first mating electrical connector 141 of each of the two first electronic devices 14 is located adjacent to a height rising part of the step-shaped structure.

The aforementioned configuration enables the first electronic device 14 to have a shorter length in a longitudinal direction parallel to the first direction D1 and the second direction D2, such that a length of the electronic apparatus 1 in the longitudinal direction can match with a depth of the cabinet 2 in the longitudinal direction for preventing the electronic apparatus 1 mounted on the cabinet 2 from protruding out of the cabinet 2 in the longitudinal direction.

Preferably, as shown in FIG. 2 to FIG. 6, the casing kit 100 further includes a supporting component 16 configured to support the auxiliary circuit board 13.

Specifically, the casing 11 further includes a first longitudinal wall LW1 and a second longitudinal wall LW2. The second longitudinal wall LW2 is located between the first longitudinal wall LW1 and the fourth wall W4. An inner one of the two mounting slots 111 is defined by the first longitudinal wall LW1 and the second longitudinal wall LW2 cooperatively. An outer one of the two mounting slots 111 is defined by the second longitudinal wall LW2 and the fourth wall W4 cooperatively. The supporting component 16 is spanned between the first longitudinal wall LW1 and the second longitudinal wall LW2. Furthermore, the casing kit 100 further includes a bracket 17 fixedly connected to the casing 11 and the supporting component 16 and configured to carry the auxiliary circuit board 13. In other words, in this embodiment, the supporting component 16 is configured to support the auxiliary circuit board 13 indirectly.

Understandably, in another embodiment, the supporting component can be omitted, and the bracket can be fixed on the casing and configured to carry the auxiliary circuit board and support the auxiliary circuit board directly. Alternatively, in another embodiment, the bracket can be omitted, and the supporting component can be configured to carry the auxiliary circuit board and support the auxiliary circuit board directly.

Additionally, each of the two second electronic devices 15 includes a second mating electrical connector 151, a third mating electrical connector 152 and a fourth mating electrical connector 153. The auxiliary circuit board 13 further includes two third electrical connectors 134. The main circuit board 12 further includes two fourth electrical connectors 121 and two fifth electrical connectors 122. When each of the two second electronic devices 15 is inserted into the corresponding second mounting slot 112 through the corresponding third opening O3 along the first direction D1, the second mating electrical connector 151, the third mating electrical connector 152 and the fourth mating electrical connector 153 of each of the two electronic devices 15 are connected to the corresponding third electrical connector 134, the corresponding fourth electrical connector 121 and the corresponding fifth electrical connector 122, respectively, such that each of the two second electronic devices 15 can be electrically communicated with the main circuit board 12 directly and/or through the auxiliary circuit board 13 indirectly by connections of the corresponding electrical connectors for signal and/or power transmission.

Figure 7:
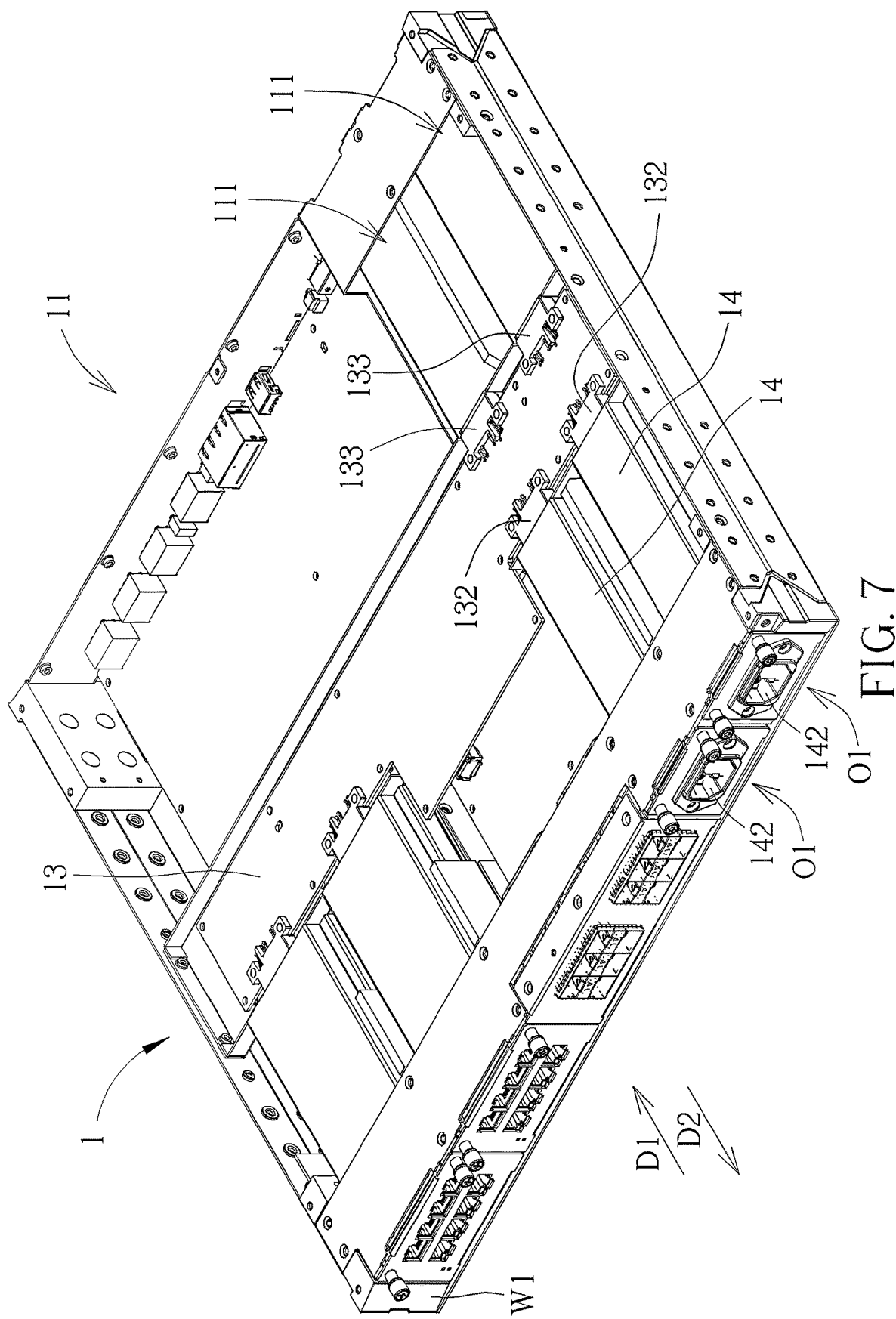
FIG. 7 and FIG. 8 are diagrams of the electronic apparatus in a first used state at different views according to the first embodiment of the present invention.
Figure 8:
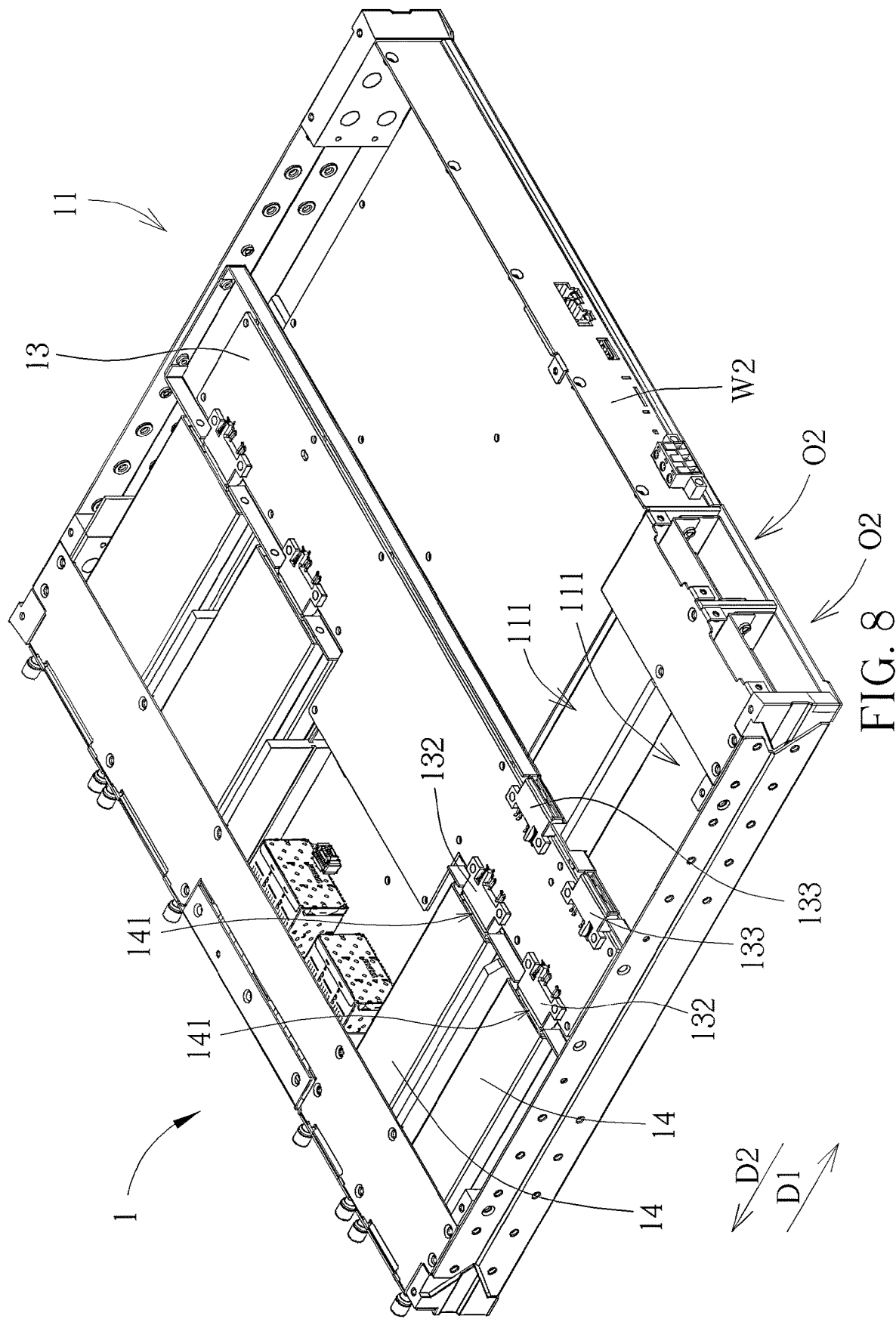
Figure 9:
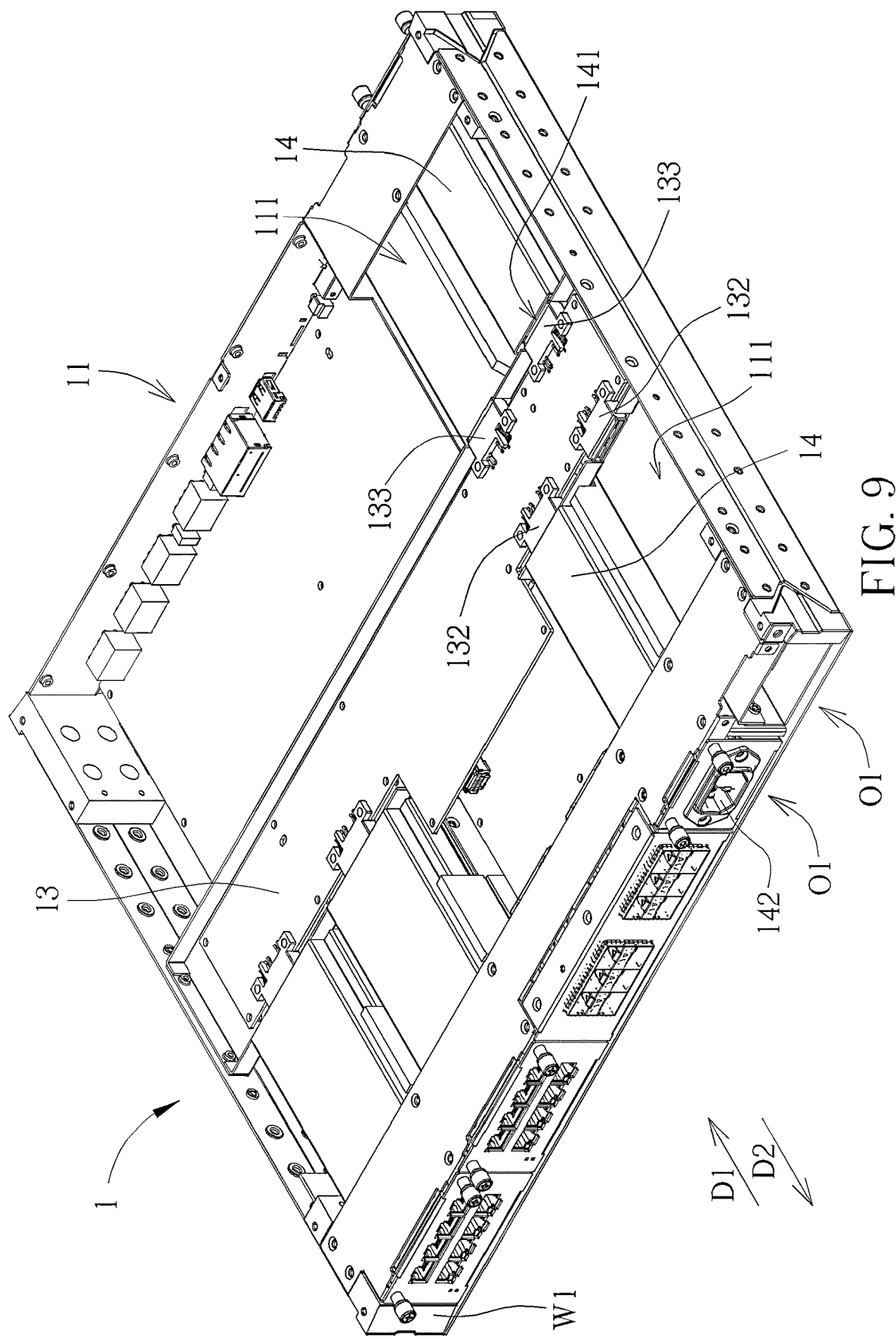
FIG. 9 and FIG. 10 are diagrams of the electronic apparatus in a second used state at different views according to the first embodiment of the present invention.
Figure 10:
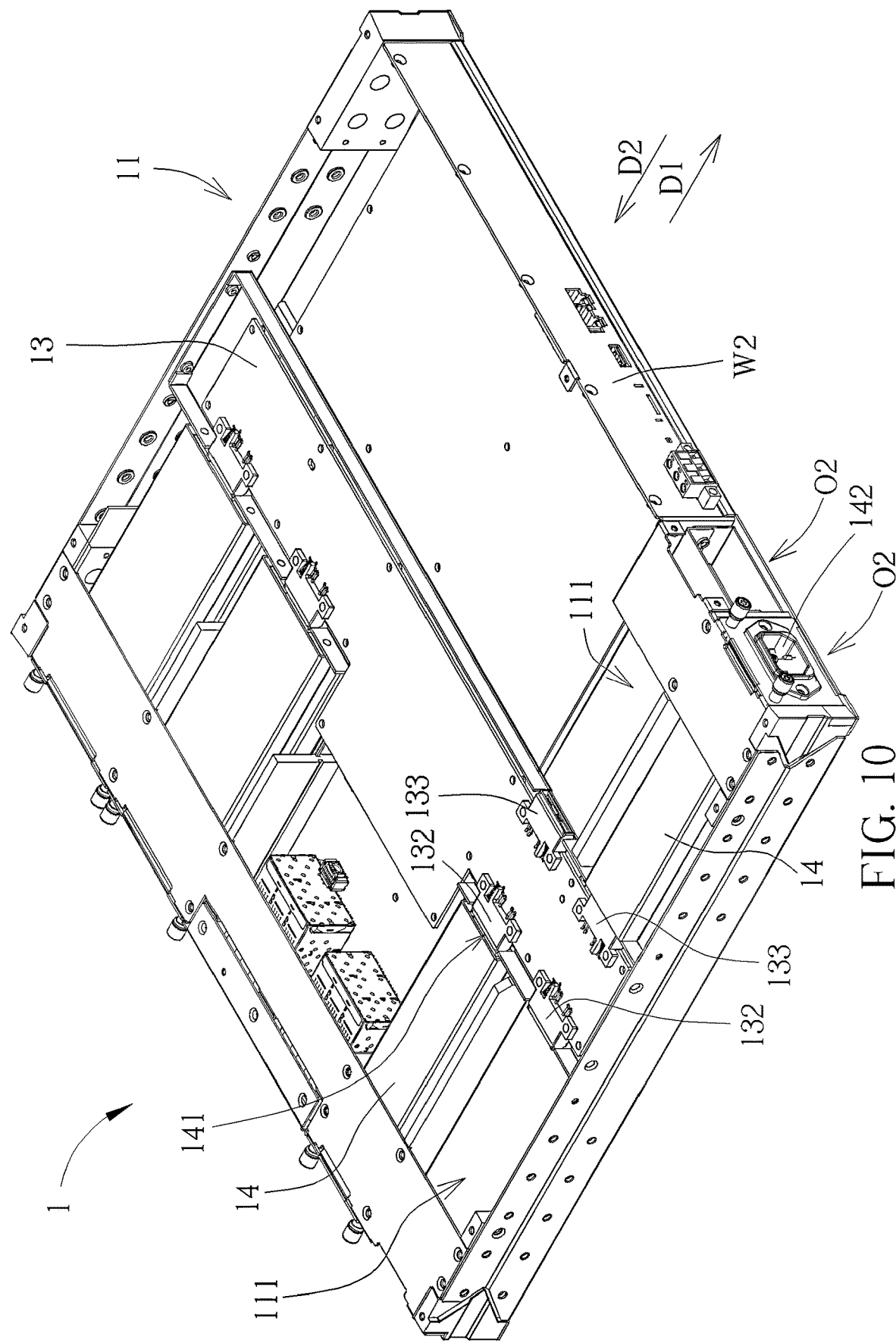
Figure 11:
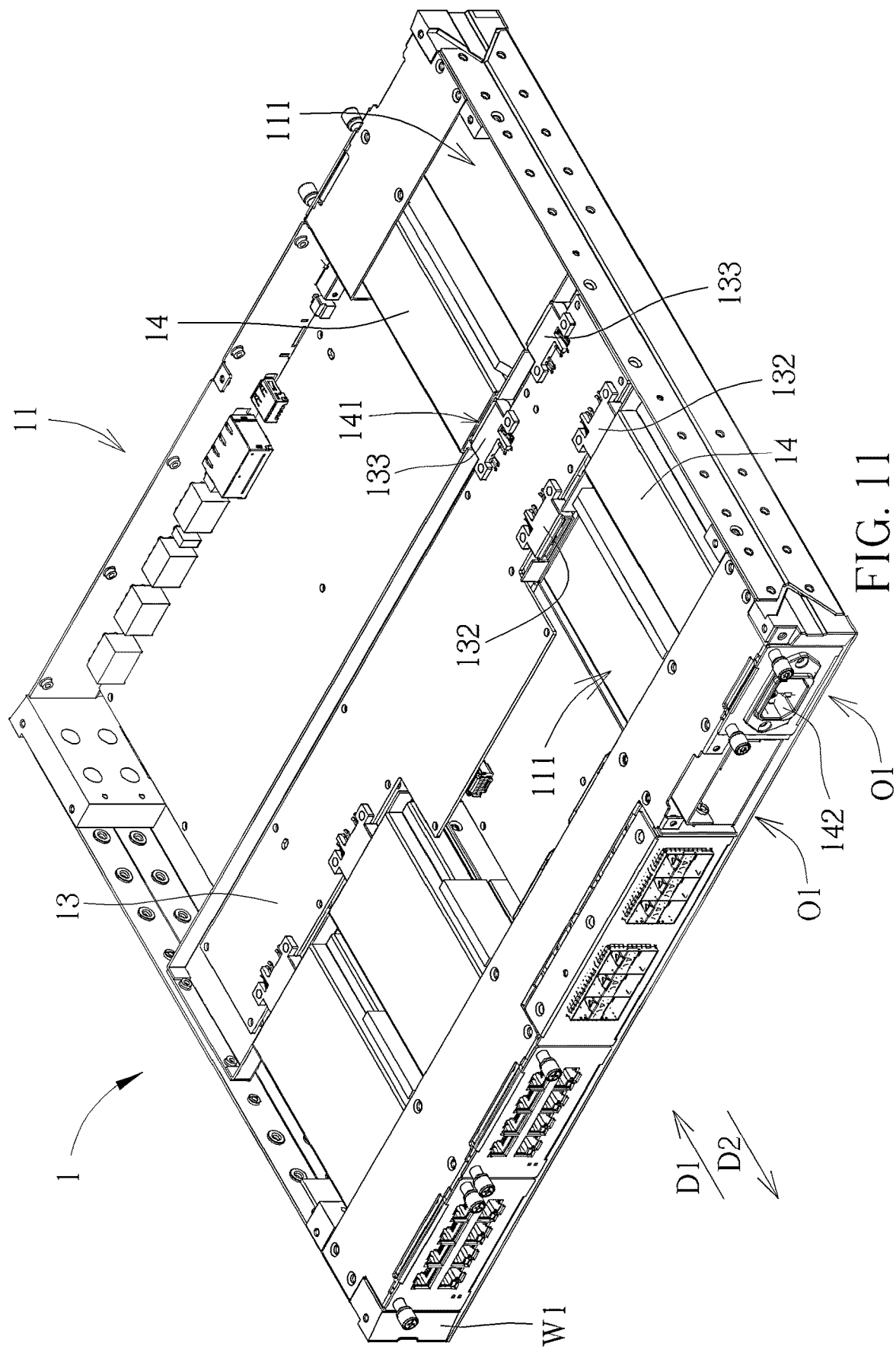
FIG. 11 and FIG. 12 are diagrams of the electronic apparatus in a third used state at different views according to the first embodiment of the present invention.
Figure 12:
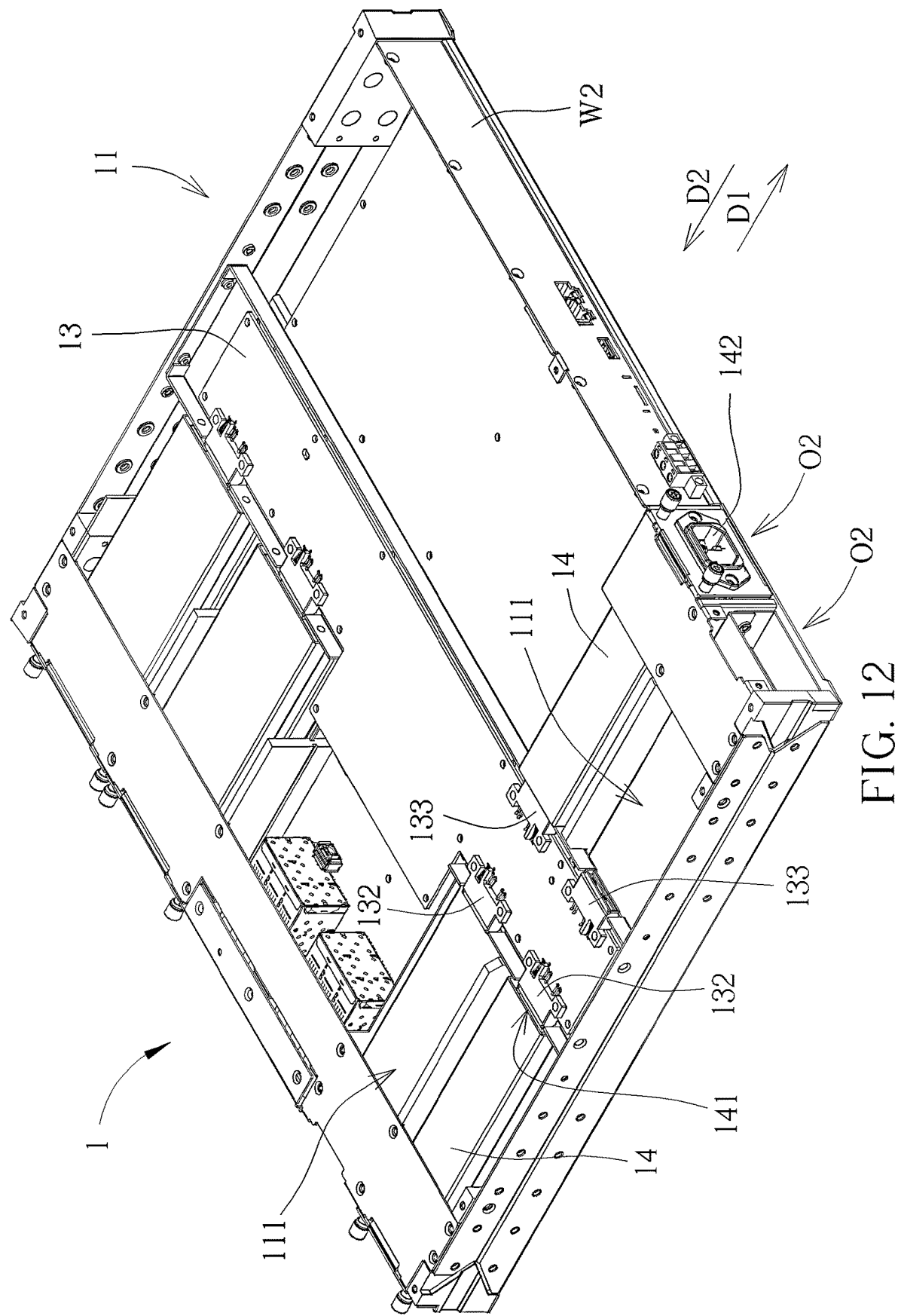
Figure 13:
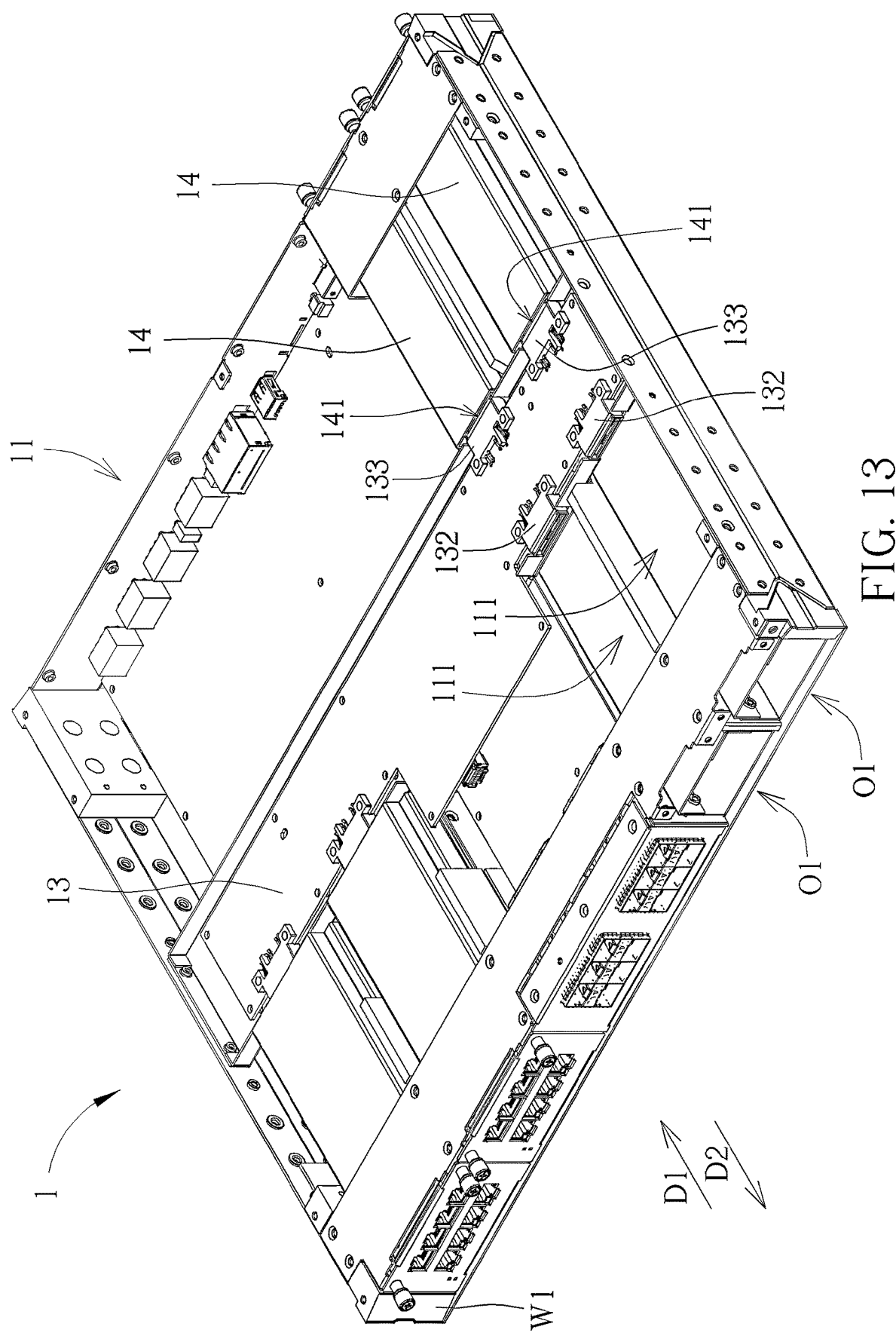
FIG. 13 and FIG. 14 are diagrams of the electronic apparatus in a fourth used state at different views according to the first embodiment of the present invention.
Figure 14:
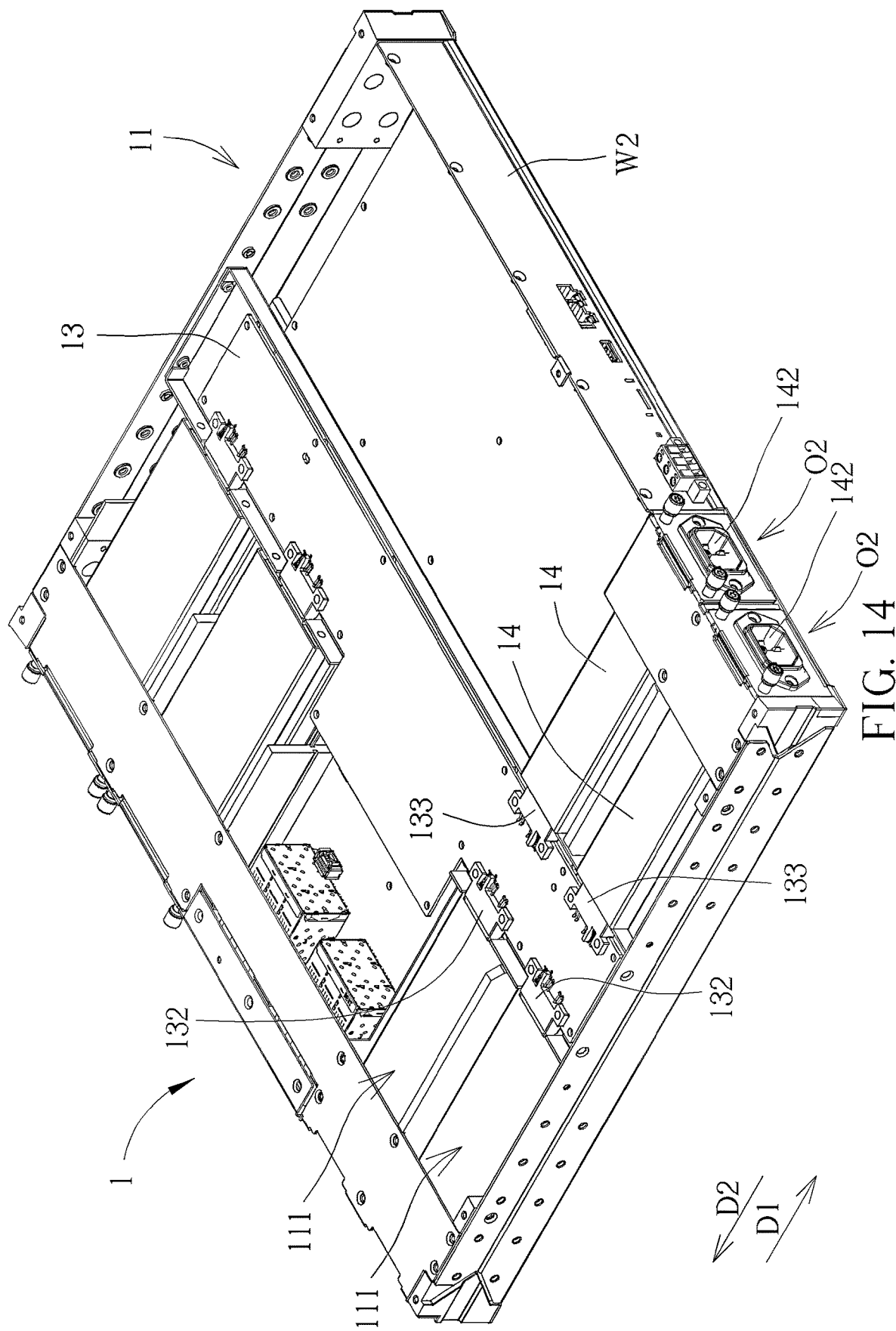

Please refer to FIG. 7 to FIG. 14. FIG. 7 and FIG. 8 are diagrams of the electronic apparatus 1 in a first used state at different views according to the first embodiment of the present invention. FIG. 9 and FIG. 10 are diagrams of the electronic apparatus 1 in a second used state 1 at different views according to the first embodiment of the present invention. FIG. 11 and FIG. 12 are diagrams of the electronic apparatus 1 in a third used state at different views according to the first embodiment of the present invention. FIG. 13 and FIG. 14 are diagrams of the electronic apparatus 1 in a fourth used state at different views according to the first embodiment of the present invention. As mentioned above, in this embodiment, the first electronic device 14 can be inserted into the corresponding first mounting slot 111 through the corresponding first opening O1 along the first direction D1 for allowing the cable to connect to the terminal 142 of the first electronic device 14 along the first direction D1 or through the corresponding second opening O2 along the second direction D2 for allowing the cable to connect to the terminal 142 of the first electronic device 14 along the second direction D2 according to practical demands. Therefore, the electronic apparatus 1 can be switched among the first used state as shown in FIG. 7 and FIG. 8, the second used state as shown in FIG. 9 and FIG. 10, the third used state as shown in FIG. 11 and FIG. 12, and the fourth used state as shown in FIG. 13 and FIG. 14.

As shown in FIG. 7 and FIG. 8, when the electronic apparatus 1 is in the first used state, the two first electronic devices 14 are respectively inserted into the two first mounting slots 111 through the two first openings O1 along the first direction D1, so as to be positioned at first predetermined positions, e.g., forward facing positions. At this moment, the first mating electrical connectors 141 of the two first electronic devices 14 are connected to the two first electrical connectors 132 of the auxiliary circuit board 13, respectively, and the terminals 142 of the two first electronic devices 14 are exposed out of the first wall W1 via the two first openings O1, respectively. Therefore, it is easy for a user to connect front cables to the terminals 142 of the two first electronic devices 14 at the forward facing positions along the first direction D1, respectively.

As shown in FIG. 9 and FIG. 10, when the electronic apparatus 1 is in the second used state, the inner first electronic device 14, which is located further away from the fourth wall W4, is inserted into the inner first mounting slot 111 through the inner first opening O1 along the first direction D1, so as to be positioned at the first predetermined position, e.g., the forward facing position, and the outer first electronic device 14, which is located more adjacent to the fourth wall W4, is inserted into the outer first mounting slot 111 through the outer second opening O2 along the second direction D2, so as to be positioned at a second predetermined position, e.g., a rearward facing position. At this moment, the first mating electrical connector 141 of the inner first electronic device 14 is connected to the inner first electrical connector 132 of the auxiliary circuit board 13, and the terminal 142 of the inner first electronic device 14 is exposed out of the first wall W1 via the inner first opening O1. Furthermore, the first mating electrical connector 141 of the outer first electronic device 14 is connected to the outer second electrical connector 133 of the auxiliary circuit board 13, and the terminal 142 of the outer first electronic device 14 is exposed out of the second wall W2 via the outer second opening O2. Therefore, it is easy for the user to connect a front cable to the terminal 142 of the inner first electronic device 14 at the forward facing position along the first direction D1 and to connect a rear cable to the terminal 142 of the outer first electronic device 14 at the rearward facing position along the second direction D2.

As shown in FIG. 11 and FIG. 12, when the electronic apparatus 1 is in the third used state, the inner first electronic device 14, which is located further away from the fourth wall W4, is inserted into the inner first mounting slot 111 through the inner second opening O2 along the second direction D2, so as to be positioned at the second predetermined position, e.g., the rearward facing position, and the outer first electronic device 14, which is located more adjacent to the fourth wall W4, is inserted into the outer first mounting slot 111 through the outer first opening O1 along the first direction D1, so as to be positioned at the first predetermined position, e.g., the forward facing position. At this moment, the first mating electrical connector 141 of the inner first electronic device 14 is connected to the inner second electrical connector 133 of the auxiliary circuit board 13, and the terminal 142 of the inner first electronic device 14 is exposed out of the second wall W2 via the inner second opening O2. Furthermore, the first mating electrical connector 141 of the outer first electronic device 14 is connected to the outer first electrical connector 132 of the auxiliary circuit board 13, and the terminal 142 of the outer first electronic device 14 is exposed out of the first wall W1 via the outer first opening O1. Therefore, it is easy for the user to connect a rear cable to the terminal 142 of the inner first electronic device 14 at the rearward facing position along the second direction D2 and to connect a front cable to the terminal 142 of the outer first electronic device 14 at the forward facing position along the first direction D1.

As shown in FIG. 13 and FIG. 14, when the electronic apparatus 1 is in the fourth used state, the two first electronic devices 14 are respectively inserted into the two first mounting slots 111 through the two second openings O2 along the second direction D2, so as to be positioned at the second predetermined positions, e.g., the rearward facing positions. At this moment, the first mating electrical connectors 141 of the two first electronic devices 14 are connected to the two second electrical connectors 133 of the auxiliary circuit board 13, respectively, and the terminals 142 of the two first electronic devices 14 are exposed out of the second wall W2 via the two second openings O2, respectively. Therefore, it is easy for a user to connect rear cables to the terminals 142 of the two first electronic devices 14 at the rearward facing positions along the second direction D2, respectively.

Understandably, the numbers and the configurations of the first electronic device, the first mounting slot, the first electrical connector, the second electrical connector, the first opening, the second opening, the second electronic device, the second mounting slot and the third opening are not limited to this embodiment. For example, in another embodiment, the electronic apparatus can include one first electronic device, one first mounting slot, one first electrical connector, one second electrical connector, one first opening, one second opening, one second electronic device, one second mounting slot and one third opening. Alternatively, in another embodiment, the electronic apparatus can include one first electronic device, one first mounting slot, one first electrical connector, one second electrical connector, one first opening and one second opening.

Besides, understandably, the numbers and the configurations of the electrical connector of the second electronic device are not limited to this embodiment. For example, in another embodiment, the second electronic device can include one second mating electrical connector configured to be connected to the third electrical connector of the auxiliary circuit board. Alternatively, in another embodiment, the second electronic device can include one third mating electrical connector configured to be connected to the fourth electrical connector of the main circuit board or one fourth mating electrical connector configured to be connected to the fifth electrical connector of the main circuit board.

Figure 15:
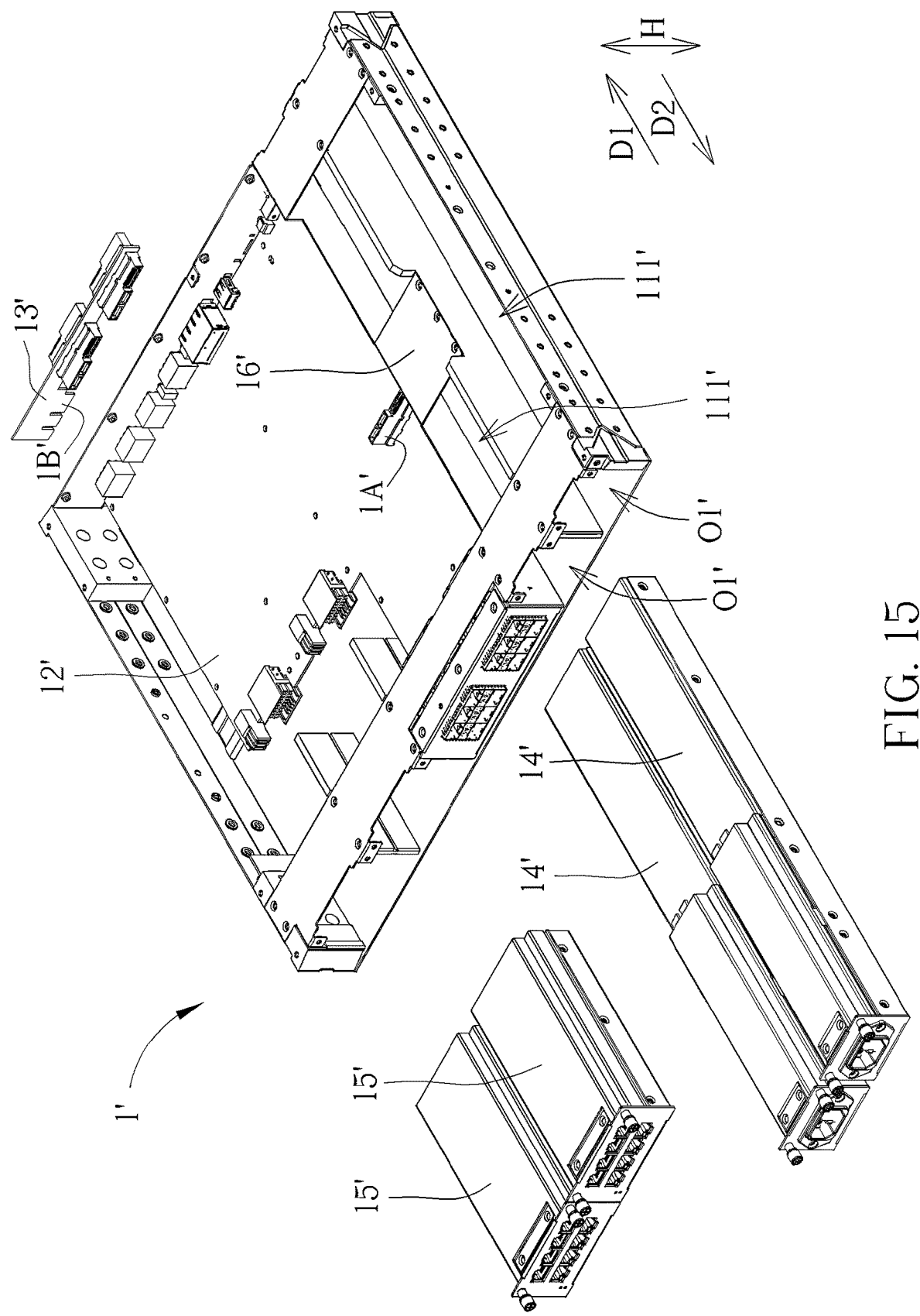
FIG. 15 and FIG. 16 are partial exploded diagrams of an electronic apparatus at different views according to a second embodiment of the present invention.
Figure 16:
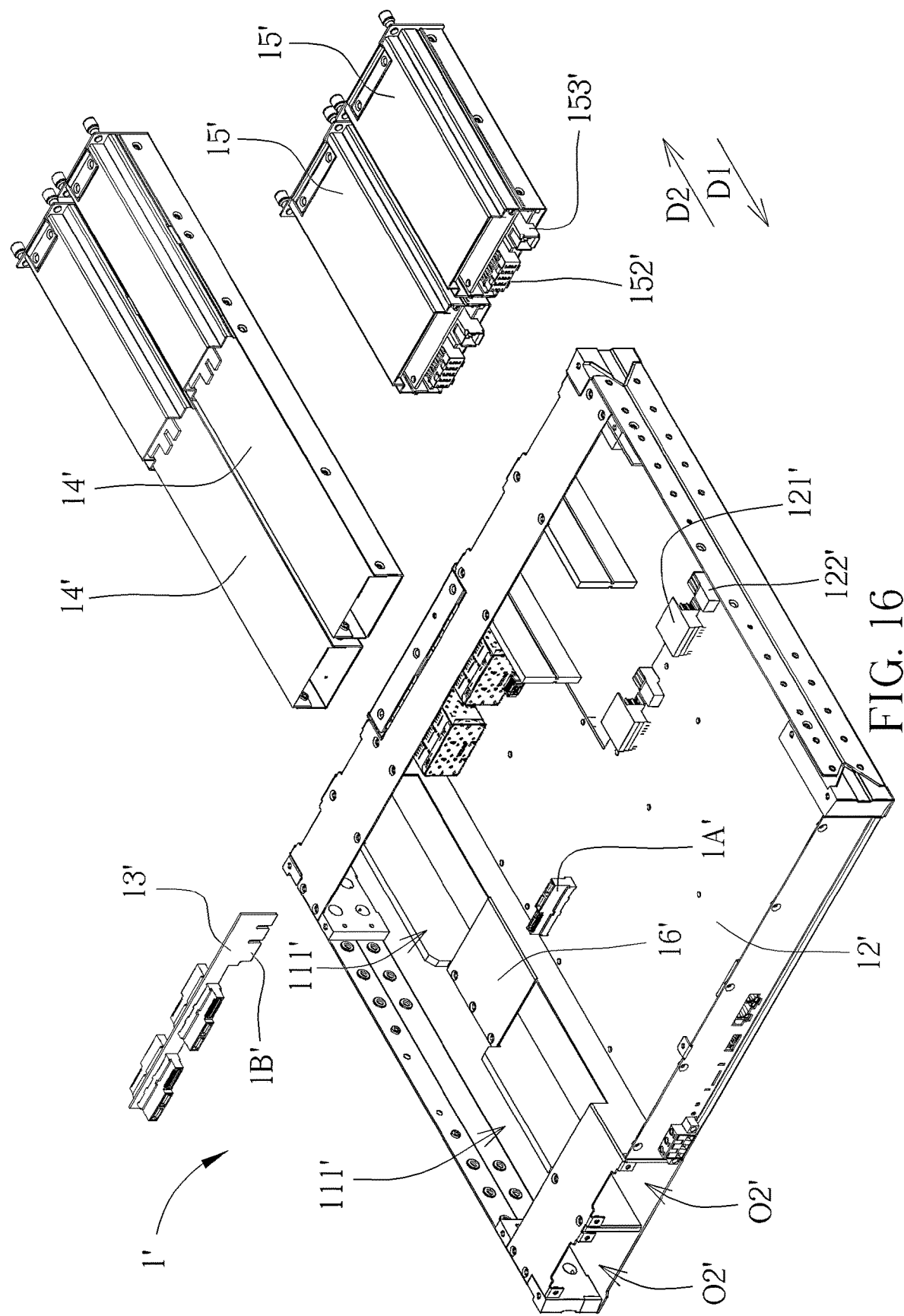
Figure 17:
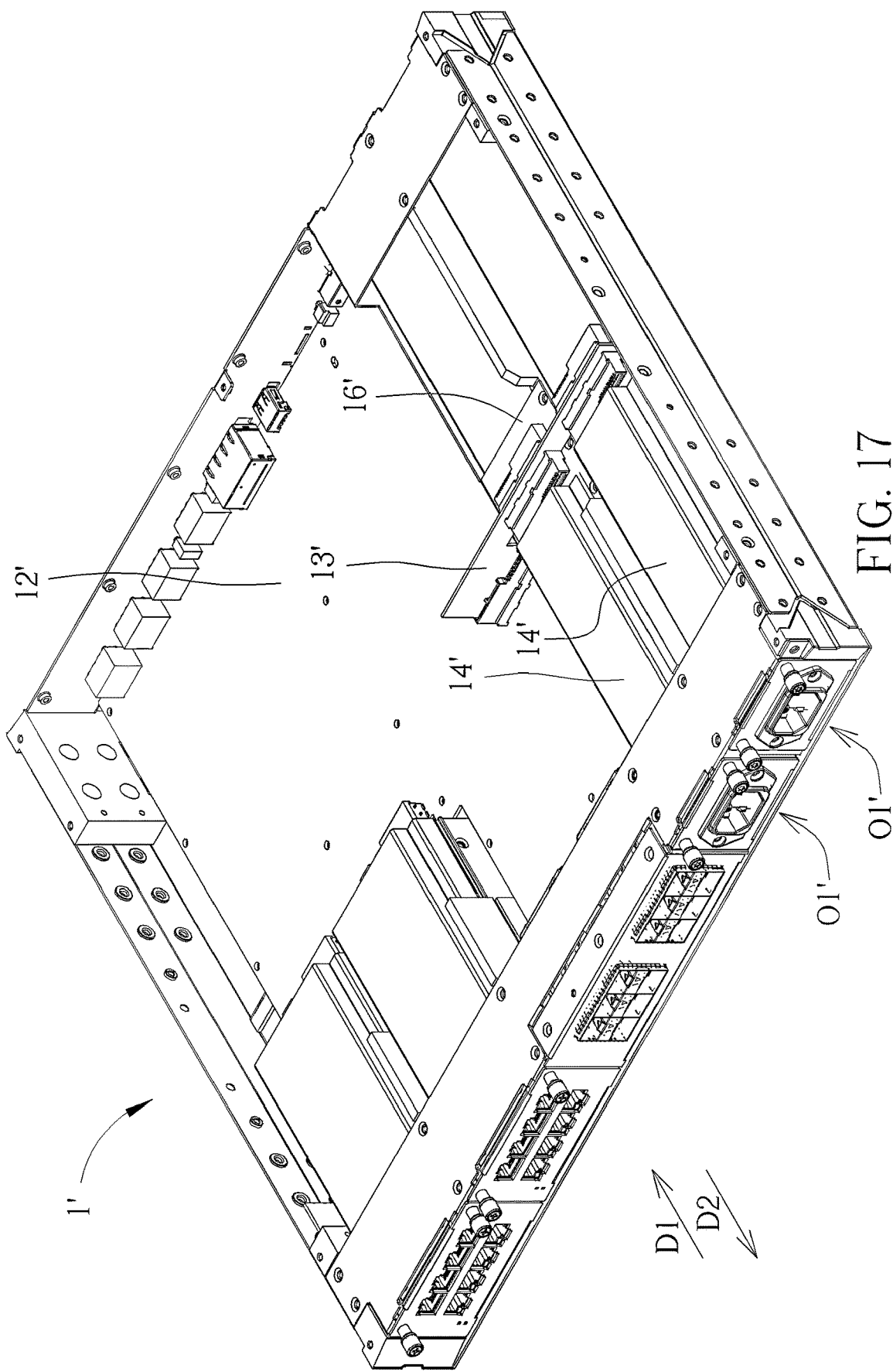
FIG. 17 and FIG. 18 are diagrams of the electronic apparatus in a first used state at different views according to the second embodiment of the present invention.
Figure 18:
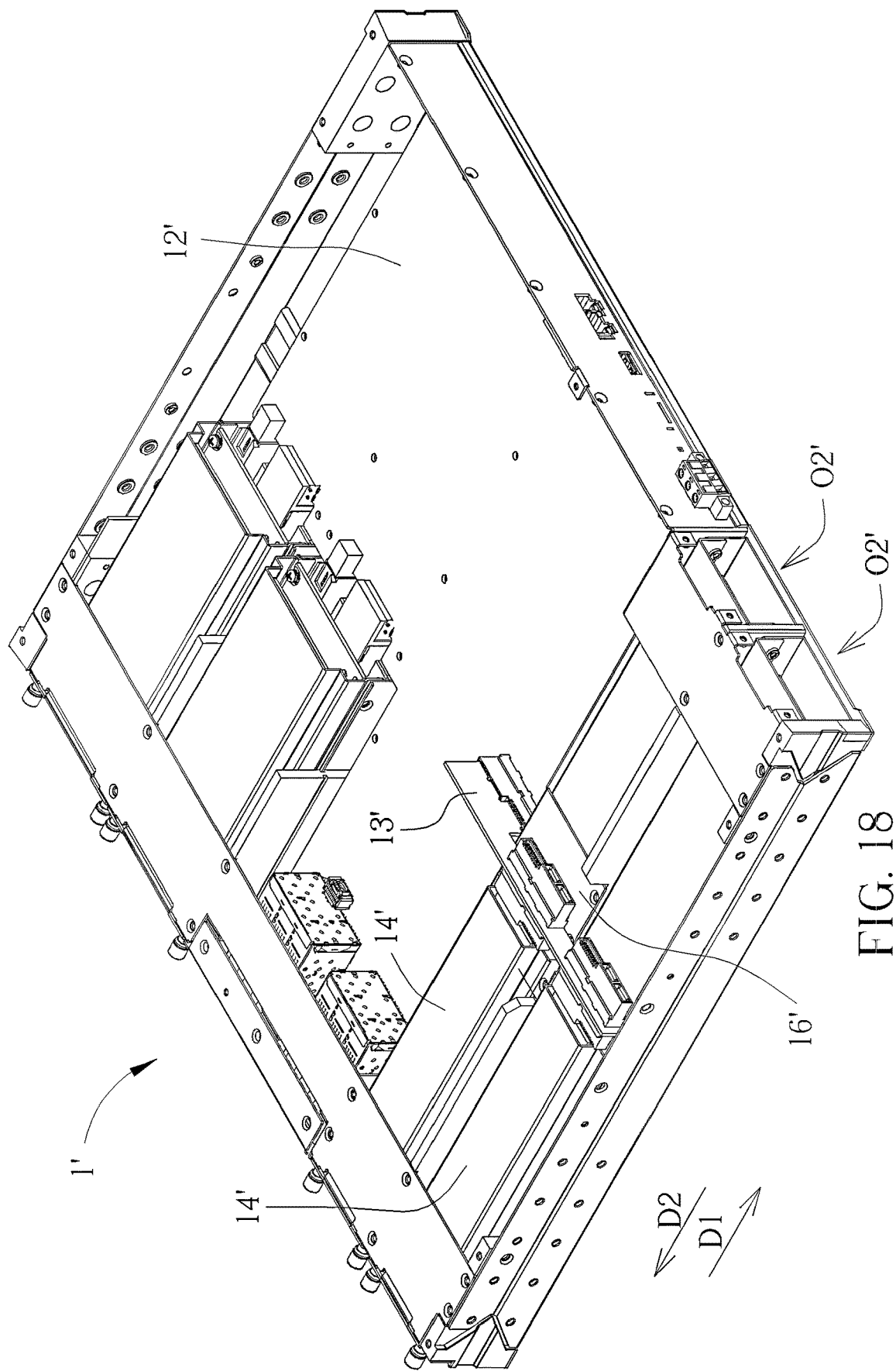
Figure 19:
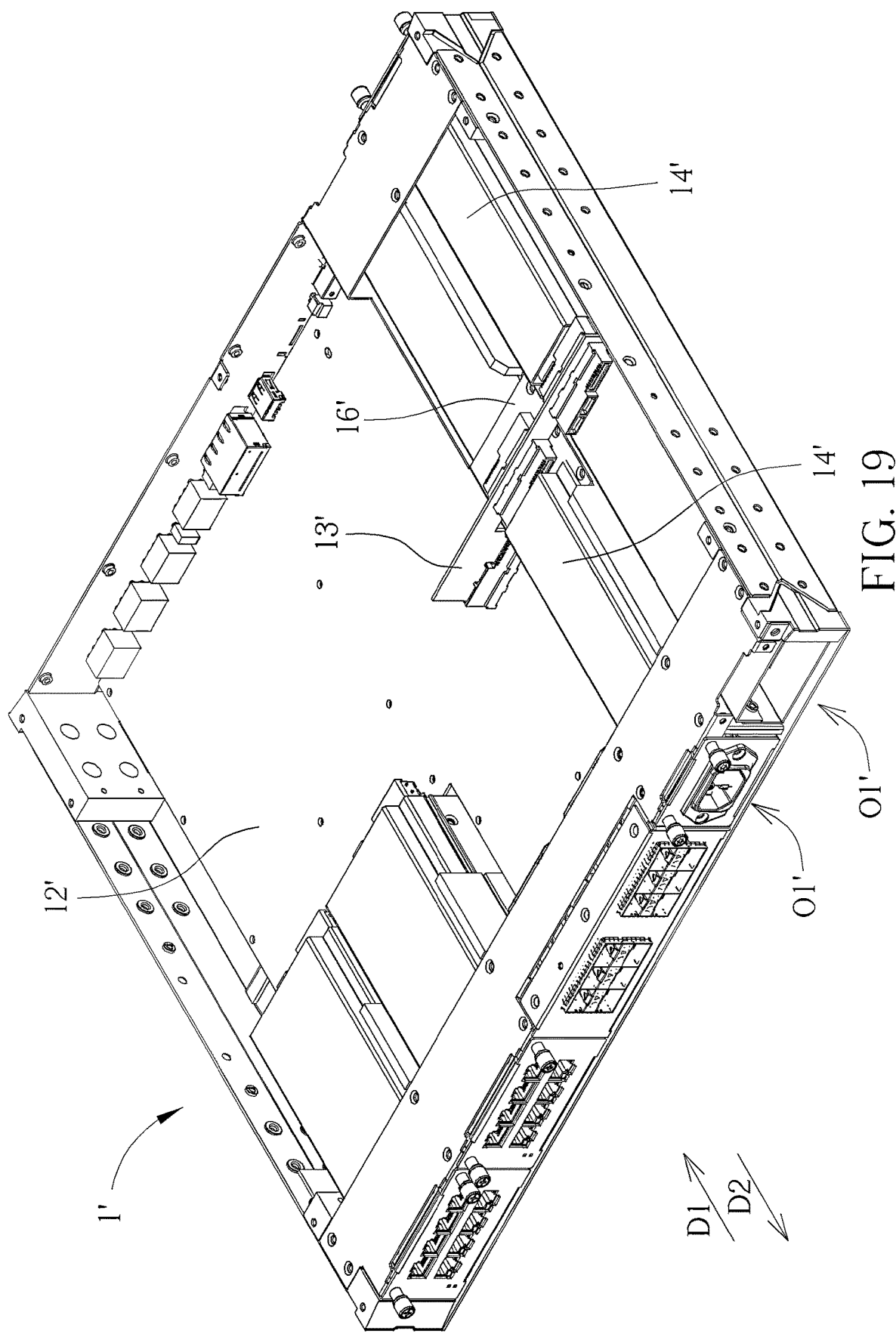
FIG. 19 and FIG. 20 are diagrams of the electronic apparatus in a second used state at different views according to the second embodiment of the present invention.
Figure 20:
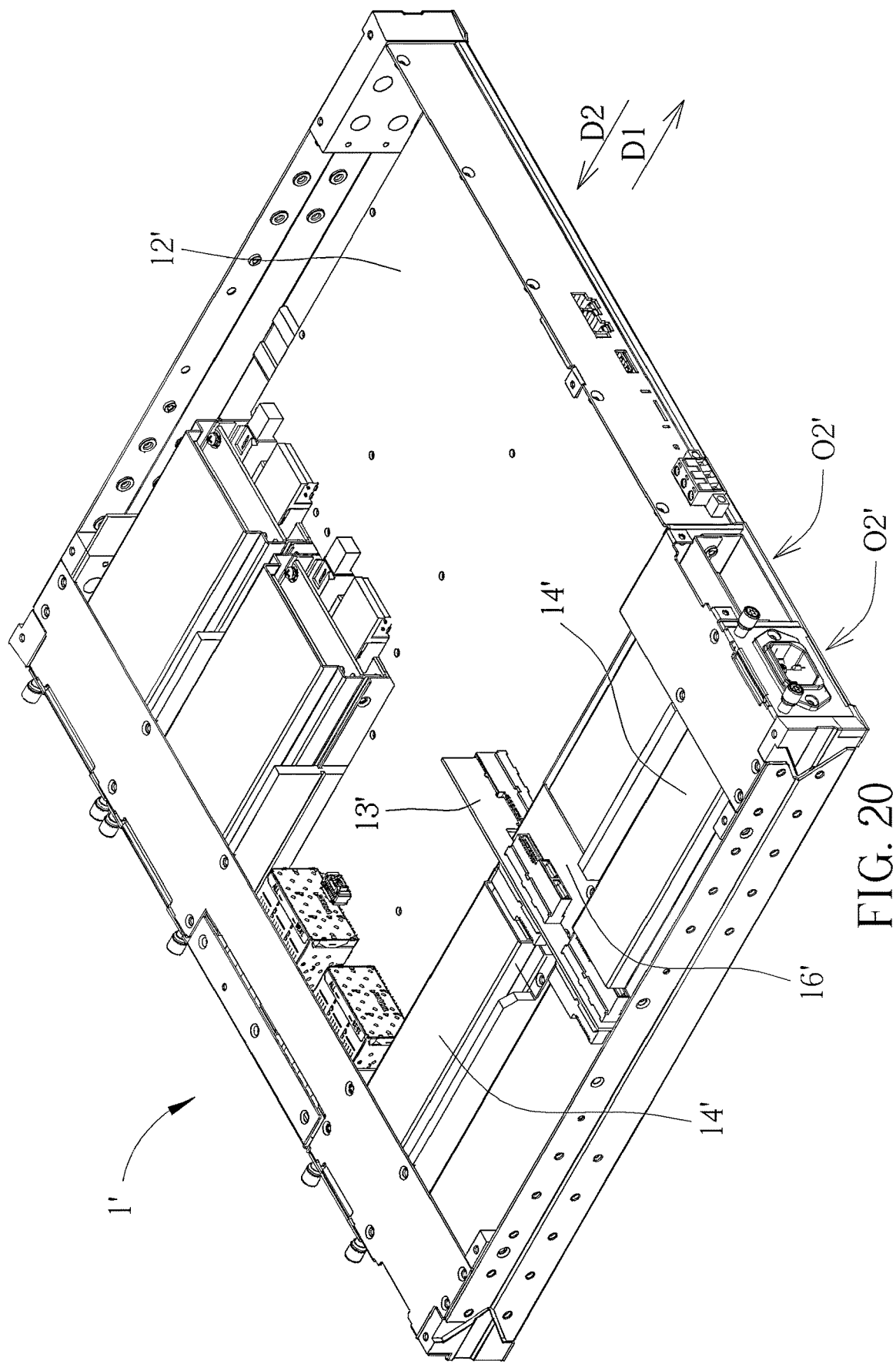
Figure 21:
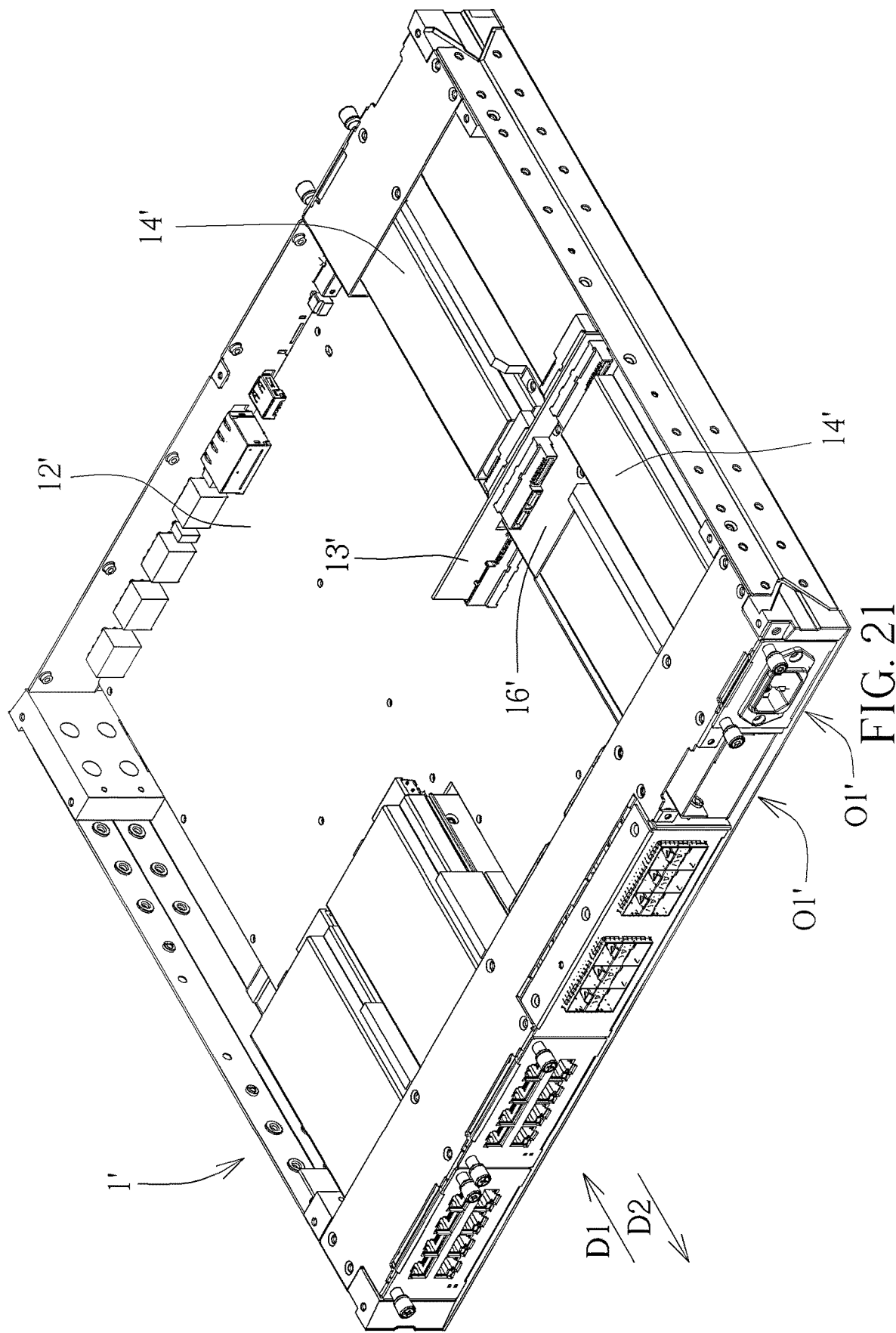
FIG. 21 and FIG. 22 are diagrams of the electronic apparatus in a third used state at different views according to the second embodiment of the present invention.
Figure 22:
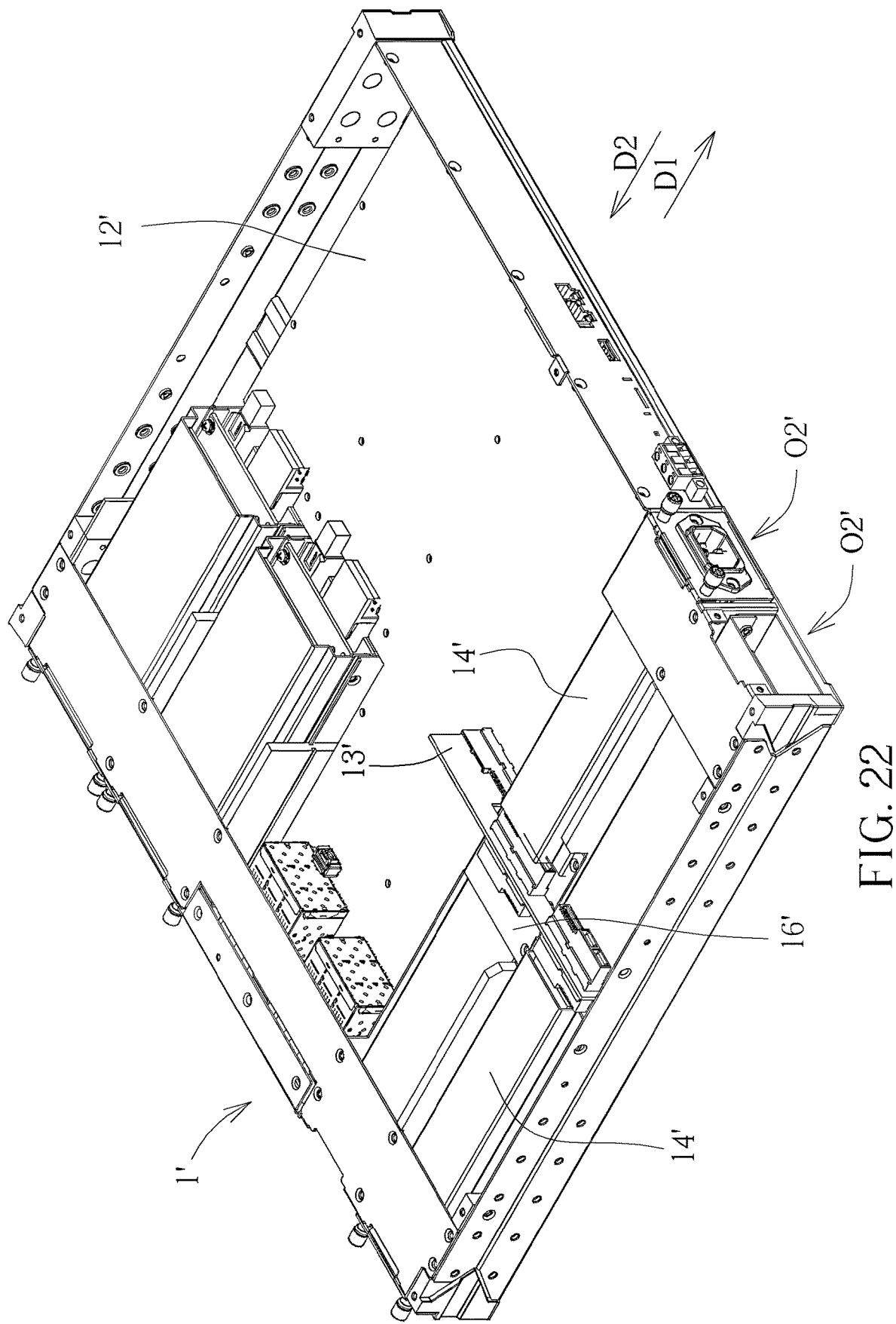
Figure 23:
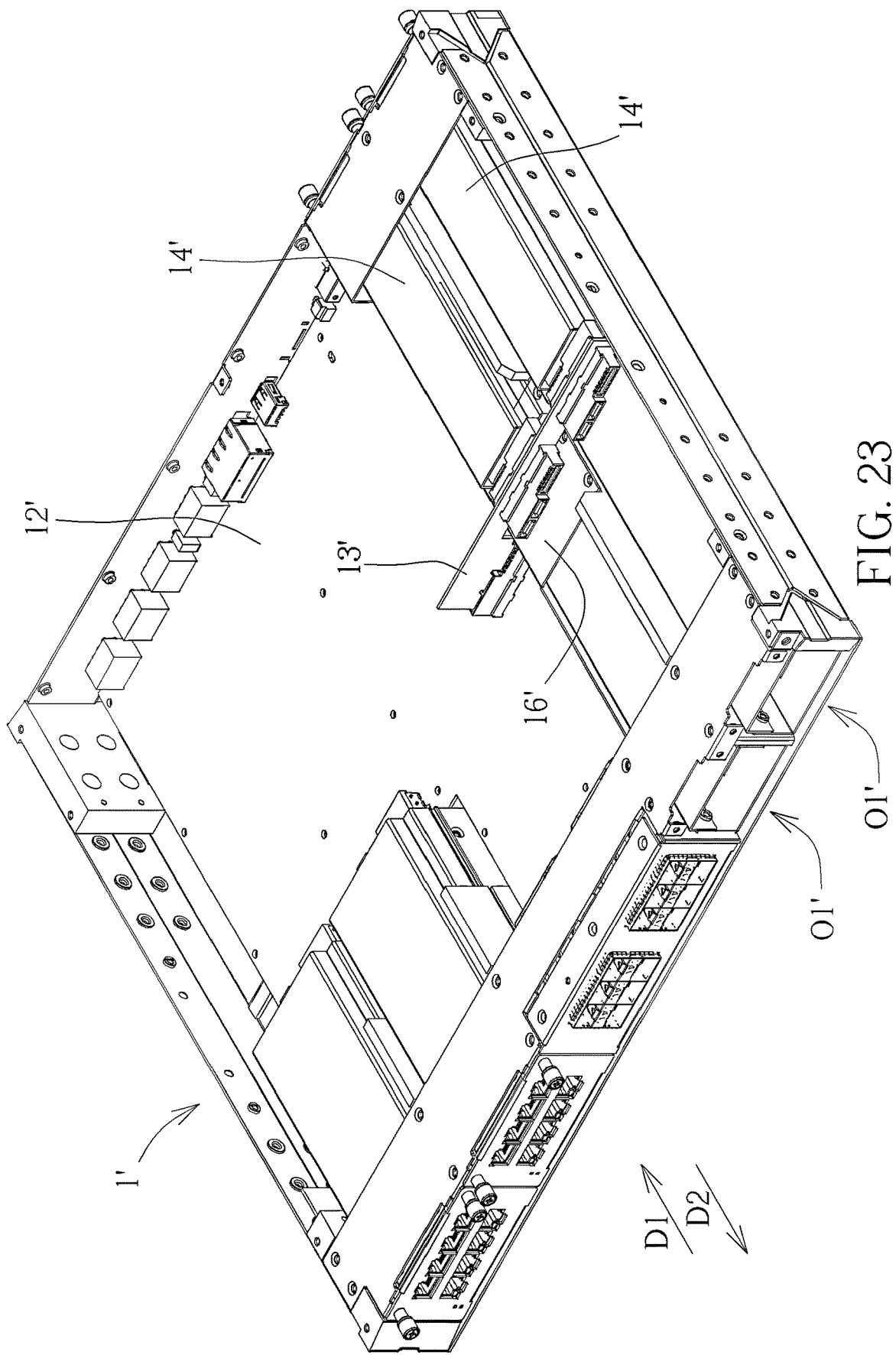
FIG. 23 and FIG. 24 are diagrams of the electronic apparatus in a fourth used state at different views according to the second embodiment of the present invention.
Figure 24:
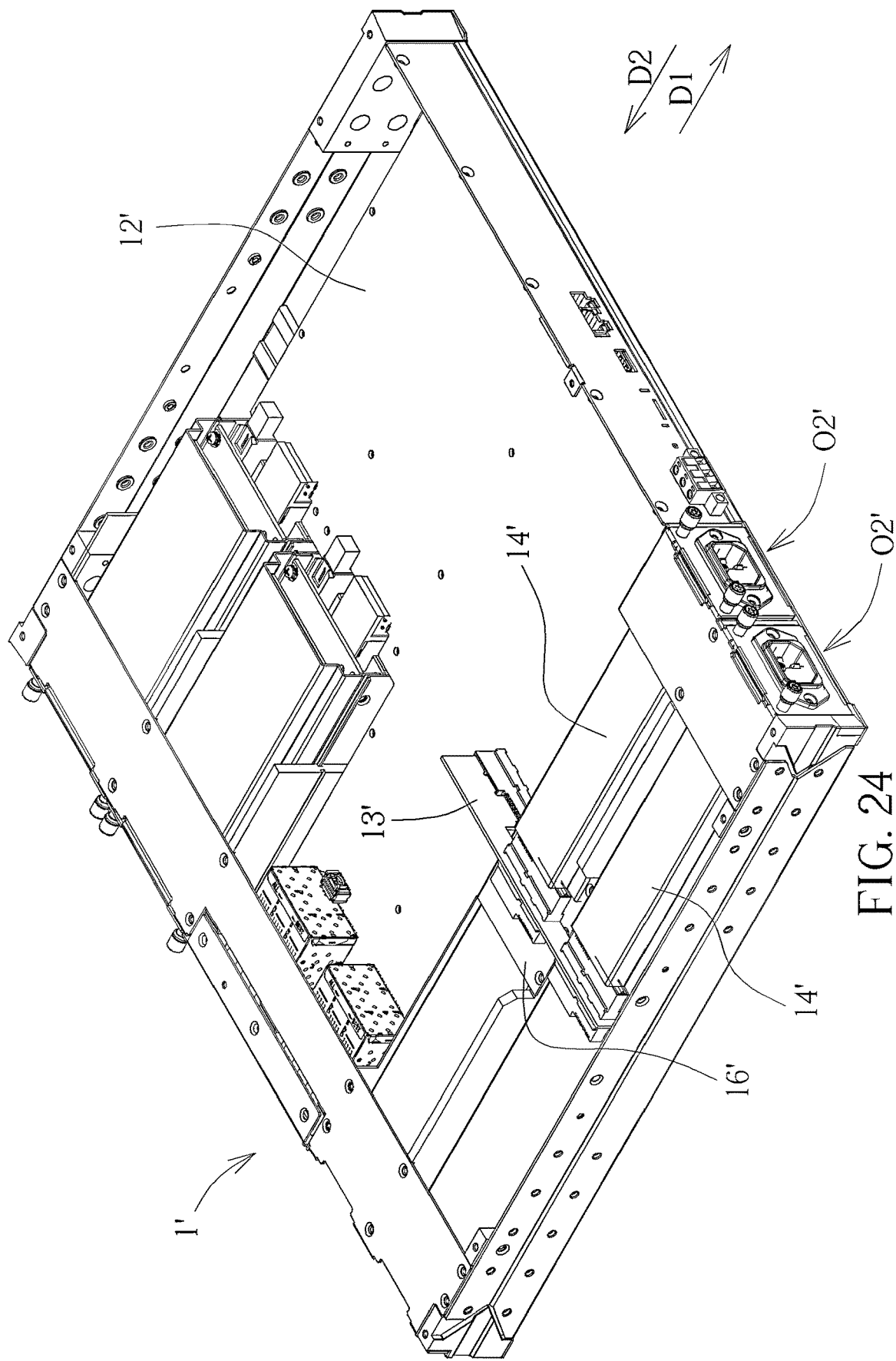

Please further refer to FIG. 15 to FIG. 24. FIG. 15 and FIG. 16 are partial exploded diagrams of an electronic apparatus 1' at different views according to a second embodiment of the present invention. FIG. 17 and FIG. 18 are diagrams of the electronic apparatus 1' in a first used state at different views according to the second embodiment of the present invention. FIG. 19 and FIG. 20 are diagrams of the electronic apparatus 1' in a second used state at different views according to the second embodiment of the present invention. FIG. 21 and FIG. 22 are diagrams of the electronic apparatus 1' in a third used state at different views according to the second embodiment of the present invention. FIG. 23 and FIG. 24 are diagrams of the electronic apparatus 1' in a fourth used state at different views according to the second embodiment of the present invention. As shown in FIG. 15 and FIG. 24, in this embodiment, a first electronic device 14' can be detachably inserted into a first mounting slot 111' through a first opening O1' along the first direction D1 or through a second opening O2' along the second direction D2, and therefore, the electronic apparatus 1' can be switched among the first used state as shown in FIG. 17 and FIG. 18, the second used state as shown in FIG. 19 and FIG. 20, the third used state as shown in FIG. 21 and FIG. 22, and the fourth used state as shown in FIG. 23 and FIG. 24. Different from the first embodiment, an auxiliary circuit board 13' and a main circuit board 12' are perpendicular to each other, and a supporting component 16' is configured to carry the auxiliary circuit board 13' and support the auxiliary circuit board 13' directly from the bottom, i.e., the bracket is omitted. Furthermore, in this embodiment, the auxiliary circuit board 13' and the main circuit board 12' can be electrically connected to each other by a first board-to-board connector 1A' and a second board-to-board connector 1B', and a second electronic device 15' includes a third mating electrical connector 152' configured to be connected to a fourth electrical connector 121' of the main circuit board 12', and a fourth mating electrical connector 153' configured to be connected to a fifth electrical connector 122' of the main circuit board 12', i.e., the second mating electrical connector and the third electrical connector are omitted. Other details of this embodiment are the same as the ones of the first embodiment and have similar variations. Detailed description is omitted herein for simplicity.

In contrast to the prior art, in the present invention, when the first electronic device is inserted into the first mounting slot of the casing through the first opening along the first direction, the first mating electrical connector of the first electronic device is connected to the first electrical connector of the auxiliary circuit board, and the terminal of the first electronic device is exposed out of the first wall of the casing via the first opening for allowing the cable to connect to the terminal of the first electronic device along the first direction. On the other hand, when the first electronic device is inserted into the first mounting slot of the casing through the second opening along the second direction, the first mating electrical connector of the first electronic device is connected to the second electrical connector of the auxiliary circuit board, and the terminal of the first electronic device is exposed out of the second wall of the casing via the second opening for allowing the cable to connect to the terminal of the first electronic device along the second direction. The present invention has a cable routing orientation switchable between a forward orientation and a rearward orientation to allow front-end cable routing or rear-end cable routing according to a field cable layout, and therefore, the present invention has improved flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic apparatus with a two-way cable connection construction, the electronic apparatus comprising:
   a casing kit comprising:
      a casing comprising a first wall, a second wall and a first mounting slot, the second wall being opposite to the first wall, a first opening being formed on the first wall of the casing and communicated with the first mounting slot, and a second opening being formed on the second wall of the casing and communicated with the first mounting slot;
   a main circuit board disposed inside the casing; and
   an auxiliary circuit board disposed inside the casing and electrically connected to the main circuit board, the auxiliary circuit board and the main circuit board being non-coplanar with each other, the auxiliary circuit board comprising a board body, a first electrical connector and a second electrical connector, the first electrical connector and the second electrical connector being respectively disposed on a first side of the board body and a second side of the board body opposite to the first side of the board body; and a first electronic device configured to be detachably inserted into the first mounting slot of the casing, when the first electronic device is inserted into the first mounting slot of the casing through the first opening along a first direction, a first mating electrical connector of the first electronic device being connected to the first electrical connector of the auxiliary circuit board, when the first electronic device is inserted into the first mounting slot of the casing through the second opening along a second direction opposite to the first direction, the first mating electrical connector of the first electronic device being connected to the second electrical connector of the auxiliary circuit board.

2. The electronic apparatus of claim 1, wherein the auxiliary circuit board and the main circuit board are stacked one above another.

3. The electronic apparatus of claim 2, further comprising a second electronic device, the casing further comprising a second mounting slot, and a third opening being formed on the first wall of the casing and communicated with the second mounting slot for allowing the second electronic device to be inserted into the second mounting slot of the casing through the third opening along the first direction.

4. The electronic apparatus of claim 3, wherein the auxiliary circuit board further comprises a third electrical connector configured to be connected to a second mating electrical connector of the second electronic device when the second electronic device is inserted into the second mounting slot of the casing through the third opening along the first direction.

5. The electronic apparatus of claim 4, wherein the main circuit board further comprises a fourth electrical connector configured to be connected to a third mating electrical connector of the second electronic device when the second electronic device is inserted into the second mounting slot of the casing through the third opening along the first direction.

6. The electronic apparatus of claim 2, wherein the casing kit further comprises a supporting component configured to support the auxiliary circuit board.

7. The electronic apparatus of claim 6, wherein the casing further comprises a first longitudinal wall and a second longitudinal wall, the first mounting slot is defined by the first longitudinal wall and the second longitudinal wall cooperatively, and the supporting component is spanned between the first longitudinal wall and the second longitudinal wall.

8. The electronic apparatus of claim 7, wherein the casing kit further comprises a bracket fixedly connected to the casing and the supporting component and configured to carry the auxiliary circuit board.

9. The electronic apparatus of claim 1, wherein the auxiliary circuit board and the main circuit board are perpendicular to each other.

10. The electronic apparatus of claim 9, further comprising a second electronic device, the casing further comprising a second mounting slot, and a third opening being formed on the first wall of the casing and communicated with the second mounting slot for allowing the second electronic device to be inserted into the second mounting slot of the casing through the third opening along the first direction.

11. The electronic apparatus of claim 10, wherein the main circuit board further comprises a fourth electrical connector configured to be connected to a third mating electrical connector of the second electronic device when the second electronic device is inserted into the second mounting slot of the casing through the third opening along the first direction.

12. The electronic apparatus of claim 9, wherein the casing kit further comprises a supporting component configured to support the auxiliary circuit board.

13. The electronic apparatus of claim 12, wherein the casing further comprises a first longitudinal wall and a second longitudinal wall, the first mounting slot is defined by the first longitudinal wall and the second longitudinal wall cooperatively, and the supporting component is spanned between the first longitudinal wall and the second longitudinal wall.

14. The electronic apparatus of claim 1, wherein the casing kit further comprises a supporting component configured to support the auxiliary circuit board.

15. The electronic apparatus of claim 14, wherein the casing further comprises a first longitudinal wall and a second longitudinal wall, the first mounting slot is defined by the first longitudinal wall and the second longitudinal wall cooperatively, and the supporting component is spanned between the first longitudinal wall and the second longitudinal wall.

16. The electronic apparatus of claim 15, wherein the casing kit further comprises a bracket fixedly connected to the casing and the supporting component and configured to carry the auxiliary circuit board.

17. The electronic apparatus of claim 1, wherein the casing kit further comprises a bracket fixedly connected to the casing and configured to carry the auxiliary circuit board.

18. The electronic apparatus of claim 1, wherein when the first electronic device is inserted into the first mounting slot of the casing through the first opening along the first direction, a terminal of the first electronic device is exposed out of the first wall of the casing via the first opening for allowing a cable to connect to the terminal of the first electronic device along the first direction, and when the first electronic device is inserted into the first mounting slot of the casing through the second opening along the second direction, the terminal of the first electronic device is exposed out of the second wall of the casing via the second opening for allowing the cable to connect to the terminal of the first electronic device along the second direction.

19. A casing kit comprising:
a casing comprising a first wall, a second wall and a first mounting slot, the second wall being opposite to the first wall, a first opening being formed on the first wall of the casing and communicated with the first mounting slot, and a second opening being formed on the second wall of the casing and communicated with the first mounting slot;
a main circuit board disposed inside the casing; and
an auxiliary circuit board disposed inside the casing and electrically connected to the main circuit board, the auxiliary circuit board and the main circuit board being non-coplanar with each other, the auxiliary circuit board comprising a board body, a first electrical connector and a second electrical connector, the first electrical connector and the second electrical connector being respectively disposed on a first side of the board body and a second side of the board body opposite to the first side of the board body.

20. The casing kit of claim 19, wherein the auxiliary circuit board and the main circuit board are stacked one above another in parallel.

21. The casing kit of claim 19, wherein the auxiliary circuit board and the main circuit board are perpendicular to each other.

22. The casing kit of claim 19, further comprising a supporting component configured to support the auxiliary circuit board.

23. The casing kit of claim 22, further comprising a first longitudinal wall and a second longitudinal wall, the first mounting slot being defined by the first longitudinal wall and the second longitudinal wall cooperatively, and the supporting component being spanned between the first longitudinal wall and the second longitudinal wall.

24. The casing kit of claim 23, further comprising a bracket fixedly connected to the casing and the supporting component and configured to carry the auxiliary circuit board.

25. The casing kit of claim 19, further comprising a bracket fixedly connected to the casing and configured to carry the auxiliary circuit board.

26. An electronic device comprising:
a mating electrical connector;
wherein the mating electrical connector is configured to be connected to a first electrical connector of an auxiliary circuit board of a casing kit when the electronic device is inserted into a first mounting slot of a casing of the casing kit along a first direction, and the mating electrical connector is further configured to be connected to a second electrical connector of the auxiliary circuit board of the casing kit when the electronic device is inserted into the first mounting slot of the casing of the casing kit along a second direction opposite to the first direction.

27. The electronic device of claim 26, further comprising a first portion and a second portion, the first portion and the second portion have different heights, so as to form a step-shaped structure cooperatively to provide an avoiding space for preventing interference with the auxiliary circuit board of the casing kit, and the mating electrical connector is located adjacent to a height rising part of the step-shaped structure.

28. The electronic device of claim 26, further comprising a terminal, the terminal being configured to be exposed out of a first wall of the casing for allowing a cable to connect to the terminal along the first direction when the electronic device is inserted into the first mounting slot of the casing along the first direction, and the terminal being further configured to be exposed out of a second wall of the casing for allowing the cable to connect to the terminal along the second direction when the electronic device is inserted into the first mounting slot of the casing along the second direction.

* * * * *